United States Patent
Uno et al.

(10) Patent No.: US 11,937,360 B2
(45) Date of Patent: Mar. 19, 2024

(54) HIGH FREQUENCY HEATING APPARATUS

(71) Applicant: Panasonic Intellectual Property Management Co., Ltd., Osaka (JP)

(72) Inventors: Takashi Uno, Shiga (JP); Daisuke Hosokawa, Shiga (JP); Fumitaka Ogasawara, Hyogo (JP); Mikio Fukui, Shiga (JP); Koji Yoshino, Shiga (JP); Yoshiharu Oomori, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 667 days.

(21) Appl. No.: 17/251,941

(22) PCT Filed: Aug. 1, 2019

(86) PCT No.: PCT/JP2019/030119
§ 371 (c)(1),
(2) Date: Dec. 14, 2020

(87) PCT Pub. No.: WO2020/027240
PCT Pub. Date: Feb. 6, 2020

(65) Prior Publication Data
US 2021/0267025 A1    Aug. 26, 2021

(30) Foreign Application Priority Data

Aug. 2, 2018  (JP) .................................. 2018-146144

(51) Int. Cl.
*H05B 6/62* (2006.01)
*H03H 7/38* (2006.01)
(Continued)

(52) U.S. Cl.
CPC ................. *H05B 6/62* (2013.01); *H03H 7/38* (2013.01); *H05B 6/50* (2013.01); *H05B 6/54* (2013.01)

(58) Field of Classification Search
CPC ... H05B 6/40; H05B 6/48; H05B 6/50; H05B 6/54; H05B 6/62; H05B 6/6455;
(Continued)

(56) References Cited

U.S. PATENT DOCUMENTS

2008/0105672 A1    5/2008 Yamamoto et al.

FOREIGN PATENT DOCUMENTS

| JP | 8-078151 | 3/1996 |
| JP | 4630189 B | 2/2011 |

(Continued)

OTHER PUBLICATIONS

International Search Report of PCT application No. PCT/JP2019/030119 dated Sep. 3, 2019.

*Primary Examiner* — Hung D Nguyen
(74) *Attorney, Agent, or Firm* — Wenderoth, Lind & Ponack, L.L.P.

(57) ABSTRACT

A high frequency heating apparatus (1A) includes the following components: a first electrode (11) that is flat; a plurality of flat second electrodes (12) that are flat; a high-frequency power supply (20); a matching unit (30); a controller (40); and an electric field regulator (50). The second electrodes (12) are placed opposite to the first electrode (11). The high-frequency power supply (20) applies a high-frequency voltage to the first electrode (11). The matching unit (30) is placed between the first electrode (11) and the high-frequency power supply (20), and is impedance-matched with the high-frequency power supply (20). The controller (40) controls the high-frequency power supply (20). The electric field regulator (50) individually
(Continued)

adjusts the electric field strengths in a plurality of regions located between first electrode (11) and the second electrodes (12). This aspect can reduce uneven heating.

9 Claims, 19 Drawing Sheets

(51) Int. Cl.
*H05B 6/50* (2006.01)
*H05B 6/54* (2006.01)

(58) Field of Classification Search
CPC .......... H05B 6/687; H05B 6/688; H03B 7/38; H03B 7/383; H03B 7/386; H03B 7/40; H03B 7/42; H03B 7/422
See application file for complete search history.

(56) References Cited

FOREIGN PATENT DOCUMENTS

| | | | |
|---|---|---|---|
| JP | 2017-050147 | | 3/2017 |
| JP | 2017050147 A | * | 3/2017 |
| JP | 2017-182885 | | 10/2017 |
| JP | 2019032963 A | * | 2/2019 |

* cited by examiner

HIGH FREQUENCY HEATING APPARATUS

CROSS-REFERENCE TO RELATED APPLICATIONS

This application is a U.S. national stage application of the PCT International Application No. PCT/JP2019/030119 filed on Aug. 1, 2019, which claims the benefit of foreign priority of Japanese patent application No. 2018-146144 filed on Aug. 2, 2018, the contents all of which are incorporated herein by reference.

TECHNICAL FIELD

The present disclosure relates to a high frequency heating apparatus for dielectrically heating a heating target object placed between two opposing flat electrodes by applying a high-frequency voltage between the electrodes.

BACKGROUND ART

This type of high frequency heating apparatuses known in the art have a structure described below (see, Patent Literatures 1 and 2).

Patent Literature 1 discloses a high frequency heating apparatus including the following components: a top electrode, a bottom electrode placed below the top electrode, and a voltage application unit that applies a high-frequency voltage between the top and bottom electrodes. The top electrode is surrounded by an auxiliary electrode. The voltage application unit applies a voltage between the bottom electrode and the auxiliary electrode, which is different from the high-frequency voltage applied between the top and bottom electrodes.

Patent Literature 2 discloses a high frequency thawing apparatus including the following components: a first electrode, a second electrode, and a high frequency power supply unit. The apparatus uses dielectric heating to thaw frozen food that has been processed to have a uniform thickness. The first electrode has the shape of a plate smaller than the surface for holding the frozen food. The second electrode has the shape of a plate larger than the first electrode. The high frequency power supply unit provides the frozen food with a high frequency power via the first electrode and then via the second electrode.

CITATION LIST

Patent Literature

PTL 1: Japanese Unexamined Patent Application Publication No. 2017-182885
PTL 2: Japanese Patent No. 4630189

SUMMARY OF THE INVENTION

However, the high frequency heating apparatuses disclosed in Patent Literatures 1 and 2 still have much room for improvement in terms of reducing uneven heating. Hence, a heating target object of the present disclosure is to provide a high frequency heating apparatus that reduces uneven heating.

A high frequency heating apparatus according to an aspect of the present disclosure includes the following components: a first electrode that is flat, a plurality of second electrodes that are flat, a high-frequency power supply, a matching unit, a controller, and an electric field regulator. The plurality of second electrodes are placed opposite to the first electrode. The high-frequency power supply applies a high-frequency voltage to the first electrode. The matching unit is placed between the first electrode and the high-frequency power supply, and is impedance-matched with the high-frequency power supply. The controller controls the high-frequency power supply. The electric field regulator individually adjusts the electric field strengths in a plurality of regions located between the first electrode and the plurality of second electrodes.

The high frequency heating apparatus according to this aspect can reduce uneven heating of the heating target object placed between the first electrode and the second electrodes.

DESCRIPTION OF EMBODIMENTS

Figure 1:
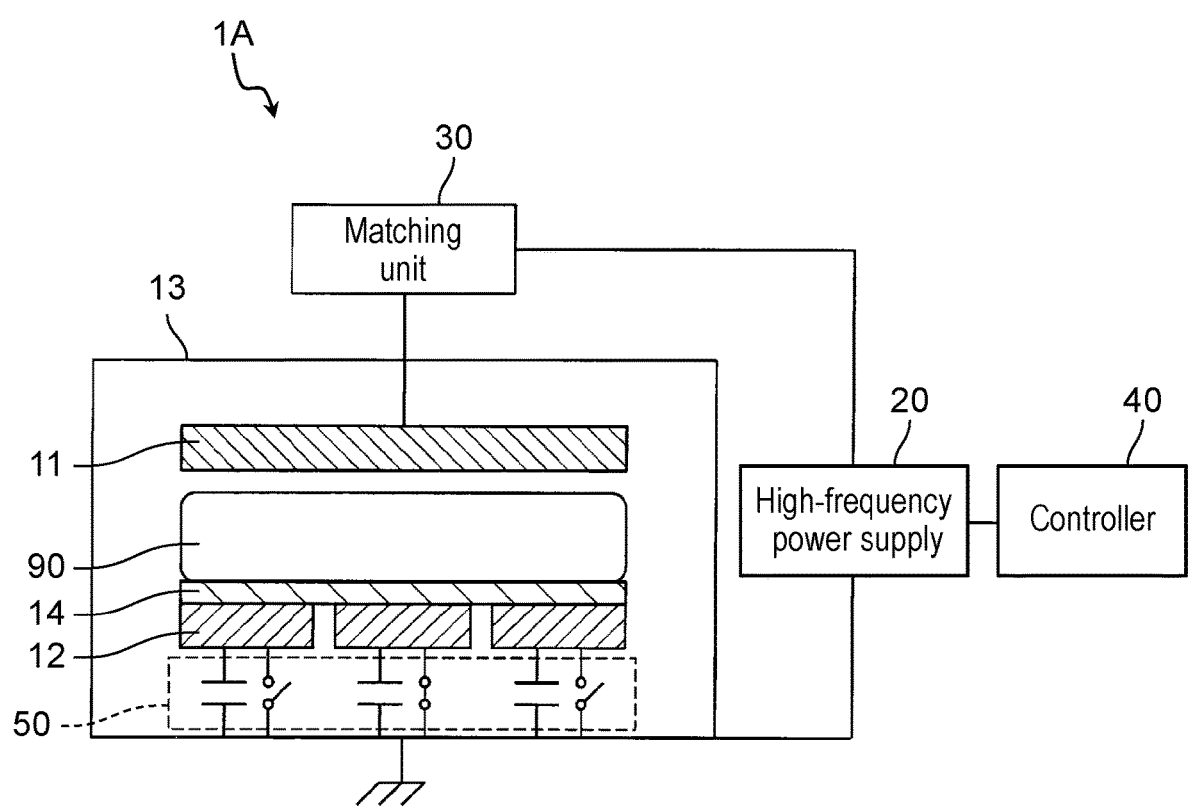
FIG. 1 is a schematic configuration of a high frequency heating apparatus according to a first exemplary embodiment of the present disclosure.

Findings on which the Present Disclosure is Based

The high frequency heating apparatus that heats a heating target object placed between opposing flat electrodes by applying a high-frequency voltage between these electrodes has variations in strength of the electric field generated between the electrodes.

For example, the electric field concentrates more around the peripheral parts of the electrodes than around the central part of the electrodes, so that the electric field strength is higher around the peripheral parts of the electrodes than around the central part of the electrodes. The electric field may concentrate in different parts of the electrodes depending on the shape of the heating target object. As a result, the high frequency heating apparatus with this structure causes uneven heating.

The inventors of the present disclosure have found a method of adjusting the strength of the electric field generated between opposing electrodes, and achieved the technique described below.

The high frequency heating apparatus according to a first aspect of the present disclosure includes the following components: a first electrode that is flat, a plurality of second electrodes that are flat, a high-frequency power supply, a matching unit, a controller, and an electric field regulator.

The plurality of second electrodes are placed opposite to the first electrode. The high-frequency power supply applies a high-frequency voltage to the first electrode. The matching unit is placed between the first electrode and the high-frequency power supply and is impedance-matched with the high-frequency power supply. The controller controls the high-frequency power supply. The electric field regulator individually adjusts the electric field strengths in a plurality of regions located between the first electrode and the plurality of second electrodes.

In the high frequency heating apparatus according to a second aspect of the present disclosure, in addition to the structure of the first aspect, the electric field regulator includes a plurality of impedance elements placed between the plurality of second electrodes and the ground. The electric field regulator makes the plurality of impedance elements adjust the impedances between the plurality of second electrodes and the ground.

In the high frequency heating apparatus according to a third aspect of the present disclosure, in addition to the structure of the second aspect, the electric field regulator further includes a plurality of switching units placed between the plurality of second electrodes and the ground. The plurality of switching units perform switching between connecting the plurality of second electrodes to the ground via the plurality of impedance elements, and connecting the plurality of second electrodes to the ground directly.

In the high frequency heating apparatus according to a fourth aspect of the present disclosure, in addition to the structure of the third aspect, the electric field regulator makes the plurality of switching units connect at least one central second electrode among the plurality of second electrodes, which corresponds to the central region of the plurality of regions, directly to the ground, and connect at least one outer second electrode among the plurality of second electrodes, which corresponds to a non-central region that is a region except the central region among the plurality of regions, to the ground via one of the plurality of impedance elements.

In the high frequency heating apparatus according to a fifth aspect of the present disclosure, in addition to the structure of the first aspect, all of the plurality of second electrodes are grounded. The electric field regulator differentiates between the spacing between the first electrode and at least one central electrode among the plurality of second electrodes that corresponds to the central region of the plurality of regions, and the spacing between the first electrode and at least outer second electrode among the plurality of second electrodes that corresponds to the non-central region that is a region except the central region among the plurality of regions, thereby adjusting the electric field strengths in the plurality of regions.

In the high frequency heating apparatus according to a sixth aspect of the present disclosure, in addition to the structure of the fifth aspect, the electric field regulator includes a plurality of bar-shaped members that ground the plurality of second electrodes. The electric field regulator makes the plurality of bar-shaped members have different lengths so as to differentiate between the spacing between the first electrode and the at least one central second electrode, and the spacing between the first electrode and the at least one outer second electrode.

In the high frequency heating apparatus according to a seventh aspect of the present disclosure, in addition to the structure of the fifth aspect, the electric field regulator includes a plurality of movable units that ground the plurality of second electrodes, and the plurality of movable units move the plurality of second electrodes in the direction perpendicular to the first electrode.

In the high frequency heating apparatus according to an eighth aspect of the present disclosure, in addition to the structure of the seventh aspect, the electric field regulator controls the plurality of movable units so that the spacing between the first electrode and the at least one central second electrodes is smaller than the spacing between the first electrode and the at least one outer second electrodes.

The high frequency heating apparatus according to a ninth aspect of the present disclosure, in addition to the structure of the first aspect, further includes a detector that detects the shape of a heating target object when the heating target object is placed between the first electrode and the plurality of second electrodes. The controller controls the electric field regulator based on the shape of the heating target object detected by the detector.

The high frequency heating apparatus according to a tenth aspect of the present disclosure, in addition to the structure of the first aspect, further includes a detector that detects the temperature of a heating target object when the heating target object is placed between the first electrode and the plurality of second electrodes. The controller controls the electric field regulator based on the temperature of the heating target object detected by the detector.

Exemplary embodiments of the present disclosure will now be described with reference to the attached drawings. In each drawing, some dimensions of the components are exaggerated for easier explanation.

First Exemplary Embodiment

Overall Structure

The following is a description of high frequency heating apparatus 1A according to a first exemplary embodiment of the present disclosure. FIG. 1 is a schematic configuration of high frequency heating apparatus 1A. In FIG. 1, X, Y, and Z axes respectively represent the width, depth, and height of apparatus 1A.

As shown in FIG. 1, high frequency heating apparatus 1A includes the following components: first electrode 11, a plurality of second electrodes 12, high-frequency power supply 20, matching unit 30, controller 40, and electric field regulator 50. In the first exemplary embodiment, heating chamber 13 accommodates first electrode 11, second electrodes 12, and electric field regulator 50. Apparatus 1A further includes table 14, which is used to place heating target object 90, on the top surface of second electrodes 12. Heating target object 90 is a dielectric with a uniform thickness and can be food, for example.

In high frequency heating apparatus 1A, a high-frequency voltage is applied via first electrode 11 to heating target object 90 that is placed between first electrode 11 and second electrodes 12. Heating target object 90 is dielectrically heated by the electric field generated between first electrode 11 and second electrodes 12.

First Electrode

First electrode 11 is a flat electrode parallel to the XY plane. More specifically, first electrode 11 is rectangular in shape. In the present exemplary embodiment, first electrode 11 is placed above second electrodes 12 in heating chamber 13.

Second Electrodes

Each of second electrodes 12 is a flat electrode parallel to the XY plane. More specifically, each of second electrodes 12 is rectangular in shape and smaller than first electrode 11. Second electrodes 12 are placed in a matrix in such a manner as to oppose first electrode 11 below first electrode 11 in heating chamber 13. More specifically, second electrodes 12 may be placed in a 3×3 or 4×4 matrix.

Table 14, on which the heating target object 90 is to be placed, is arranged on the top surface of second electrodes 12.

High-Frequency Power Supply

Figure 2:
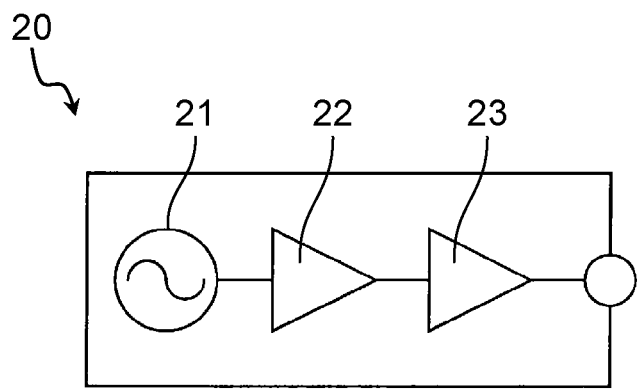
FIG. 2 is a schematic configuration of a high-frequency power supply in the first exemplary embodiment.

High-frequency power supply 20 is controlled by controller 40 and applies a high-frequency voltage to first electrode 11. FIG. 2 is a schematic configuration of high-frequency power supply 20. As shown in FIG. 2, high-frequency power supply 20 includes oscillator 21 and amplifiers 22 and 23. Oscillator 21 oscillates a voltage signal in the frequency range from HF to VHF. Amplifiers 22 and 23 amplify the voltage signal received from oscillator 21. Hence, high-frequency power supply 20 can generate a desired high-frequency voltage.

When high-frequency power supply 20 applies a high-frequency voltage to first electrode 11, an electric field is generated between first electrode 11 and second electrodes 12. This electric field dielectrically heats heating target object 90 that is placed between first electrode 11 and second electrodes 12.

Matching Unit

Figure 3:
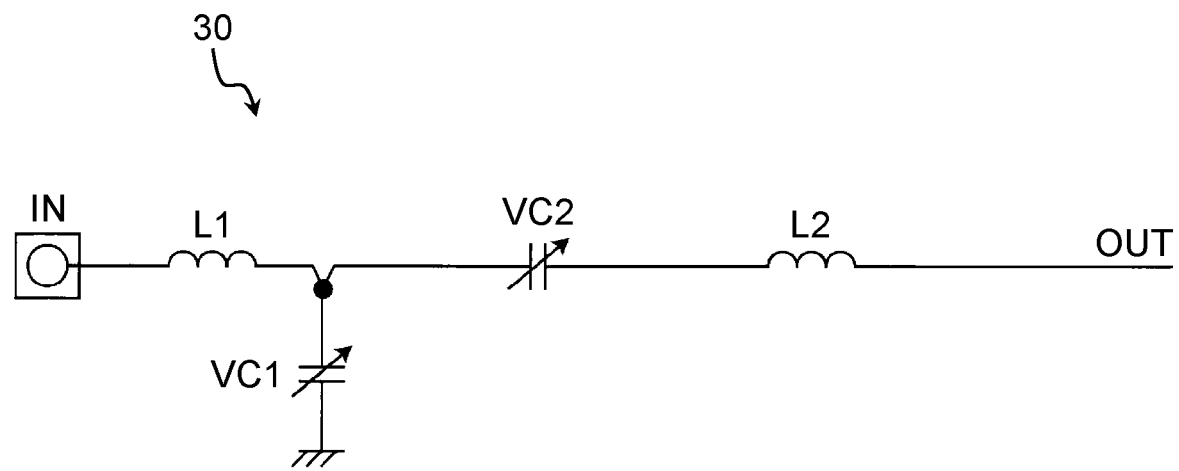
FIG. 3 is a schematic configuration of a matching unit in the first exemplary embodiment.

Matching unit 30 is placed between first electrode 11 and high-frequency power supply 20 so as to be impedance-matched with high-frequency power supply 20. FIG. 3 is a schematic configuration of matching unit 30. As shown in FIG. 3, matching unit 30 includes coils L1 and L2, and variable capacitance capacitors VC1 and VC2.

In matching unit 30, coils L1 and L2 are placed in series with variable capacitance capacitor VC2, whereas variable capacitance capacitor VC1 is placed between the ground and the terminal residing between coil L1 and variable capacitance capacitor VC2. The structure of matching unit 30 is not limited to that shown in FIG. 3.

Electric Field Regulator

Electric field regulator 50 individually adjusts the electric field strengths in a plurality of regions located between first electrode 11 and each of second electrodes 12. The plurality of regions are three-dimensional spaces defined by first electrode 11 and each of second electrodes 12.

Figure 4:
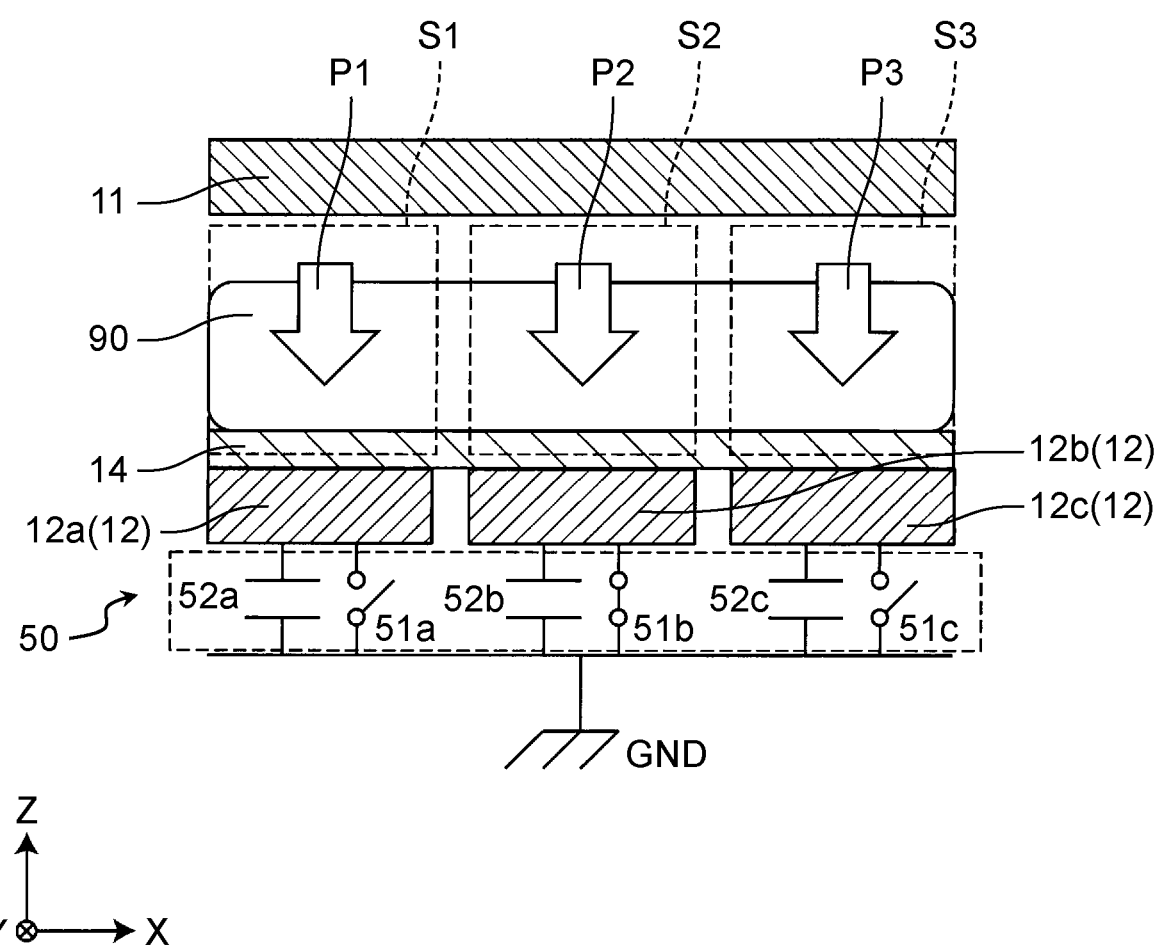
FIG. 4 is a schematic configuration of an electric field regulator in the first exemplary embodiment.

FIG. 4 is a schematic configuration of electric field regulator 50. As shown in FIG. 4, second electrodes 12 include second electrodes 12a, 12b, and 12c. Electric field regulator 50 includes switching units 51a, 51b, and 51c, and impedance elements 52a, 52b, and 52c, which are passive elements such as capacitors.

Switching unit 51a and impedance element 52a are placed between second electrode 12a and the ground. Switching unit 51b and impedance element 52b are placed between second electrode 12b and the ground. Switching unit 51c and impedance element 52c are placed between second electrode 12c and the ground.

Between first electrode 11 and the plurality of second electrodes 12, there are regions S1, S2, and S3. More specifically, the region S1 is located between first electrode 11 and second electrode 12a. The region S2 is located between first electrode 11 and second electrode 12b. The region S3 is located between first electrode 11 and second electrode 12c.

Switching unit 51a and impedance element 52a adjust an electric field strength P1 in the region 51. Switching unit 51b and impedance element 52b adjust an electric field strength P2 in the region S2. Switching unit 51c and impedance element 52c adjust an electric field strength P3 in the region S3. When switching unit 51a is turned on, second electrode 12a is directly connected to the ground. When switching unit 51a is turned off, second electrode 12a is connected to the ground via impedance element 52a. In this case, the impedance between second electrode 12a and the ground is a capacitive impedance.

As a result, the potential difference between first electrode 11 and second electrode 12a is smaller than in the case where second electrode 12a is directly connected to the ground. This can reduce the strength of the electric field generated between first electrode 11 and second electrode 12a.

Thus, switching unit 51a can be used to adjust the impedance between second electrode 12a and the ground, thereby adjusting the electric field strength P1 in the region S1 located between first electrode 11 and second electrode 12a. Switching unit 51b, impedance element 52b, and the region S2 as well as switching unit 51c, impedance element 52c, and the region S3 are in the same relationship with switching unit 51a, impedance element 52a, and the region S1.

In the present exemplary embodiment, electric field regulator 50 turns on switching unit 51b so that second electrode 12b corresponding to the central region S2 of the plurality of regions is directly connected to the ground. Electric field regulator 50 turns off switching unit 51a so that second electrode 12a corresponding to the non-central region S1 of the plurality of regions is connected to the ground via impedance element 52a. Electric field regulator 50 turns off switching unit 51c so that second electrode 12c corresponding to the non-central region S3 of the plurality of regions is connected to the ground via impedance element 52c.

In the conventional technique, applying a high-frequency voltage between the two opposing flat electrodes causes the electric field to concentrate more around the peripheral parts of the electrodes than around the central part of the electrodes. The present exemplary embodiment can prevent the electric field from concentrating around the peripheral parts of the electrodes. This results in reducing variations in the strength of the electric field generated between the electrodes.

Analysis of High Frequency Heating Apparatus La

Analysis of electric field distribution in high frequency heating apparatus 1A will now be described as follows. This analysis is performed using an analysis model of high frequency heating apparatus 1A and a high frequency structure simulator (HFSS) produced by ANSYS Corporation.

Figure 5A:
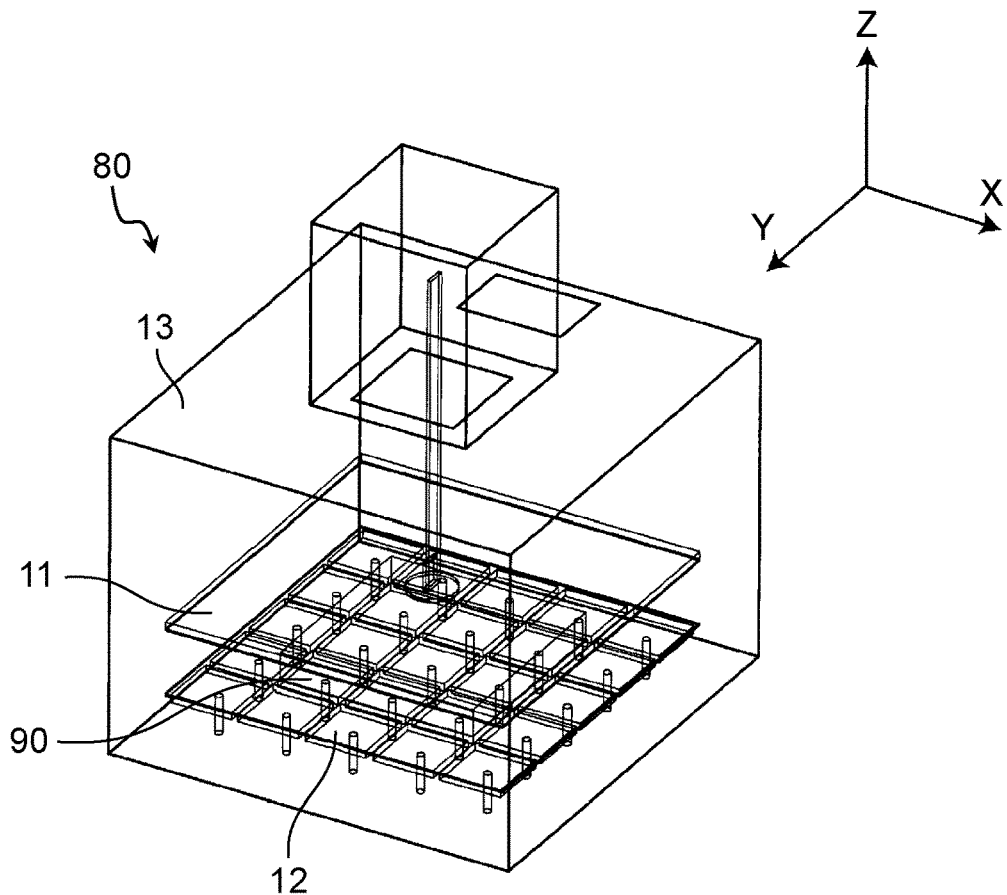
FIG. 5A is a schematic perspective view of an analysis model used for the analysis of the electric field distribution.
Figure 5B:
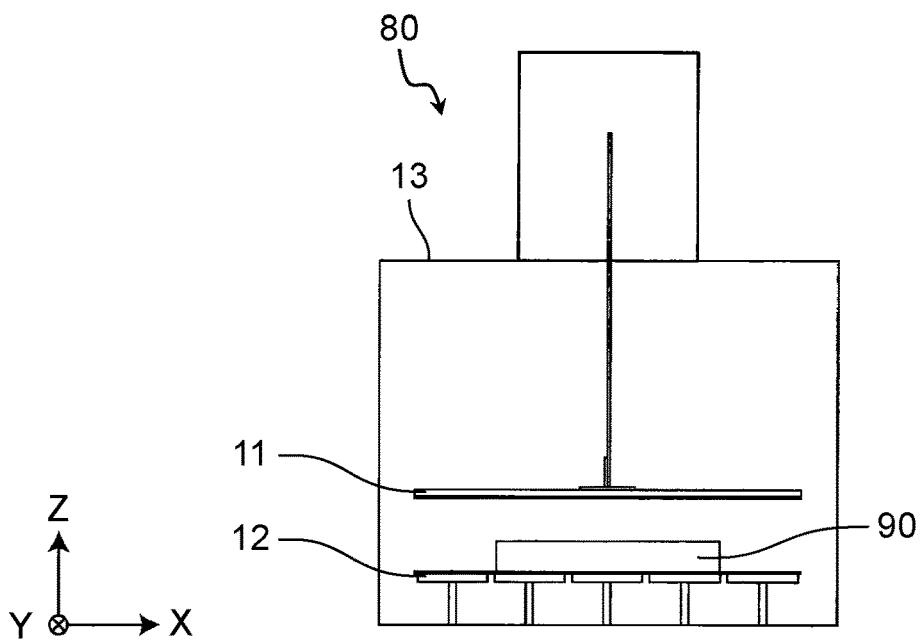
FIG. 5B is a schematic front view of the analysis model used for the analysis of the electric field distribution.

FIG. 5A is a schematic perspective view of analysis model 80 used for the analysis of the electric field distribution. FIG. 5B is a schematic front view of analysis model 80 used for the analysis of the electric field distribution. As shown in FIGS. 5A and 5B, analysis model 80 is derived from high frequency heating apparatus 1A of the present exemplary embodiment.

In analysis model 80, second electrodes 12 include a total of 25 second electrodes 12 in a 5×5 matrix. In model 80, heating target object 90 having a uniform thickness is placed between first electrode 11 and second electrodes 12.

In analysis model 80, heating chamber 13 has dimensions of 307.8 mm wide×330 mm deep×243.8 mm high. First electrode 11 has dimensions of 260 mm wide×260 mm deep×4 mm thick. Each second electrode 12 has dimensions of 47 mm wide×47 mm deep×5 mm thick. Every two adjacent second electrodes 12 have a spacing of 5 mm. Heating target object 90 has dimensions of 150 mm wide× 150 mm deep×20 mm high. Thus, the first electrode has appropriately the same size as the whole of second electrodes.

The results of the analysis of electric field distribution performed using analysis model 80 will now be described as follows. The results of the analysis performed with the adjusted strength of the electric field will be described as Example 1. The results of the analysis performed with the unadjusted strength of the electric field will be described as Comparative Example 1, which is compared with Example 1.

In Example 1, of the plurality of regions located between first electrode 11 and second electrodes 12, the second electrode 12 corresponding to the central region is directly connected to the ground, whereas the second electrodes 12 corresponding to the non-central regions are connected to the ground via the impedance elements. In Comparative Example 1, all second electrodes 12 are connected to the ground via the impedance elements.

Figure 6:
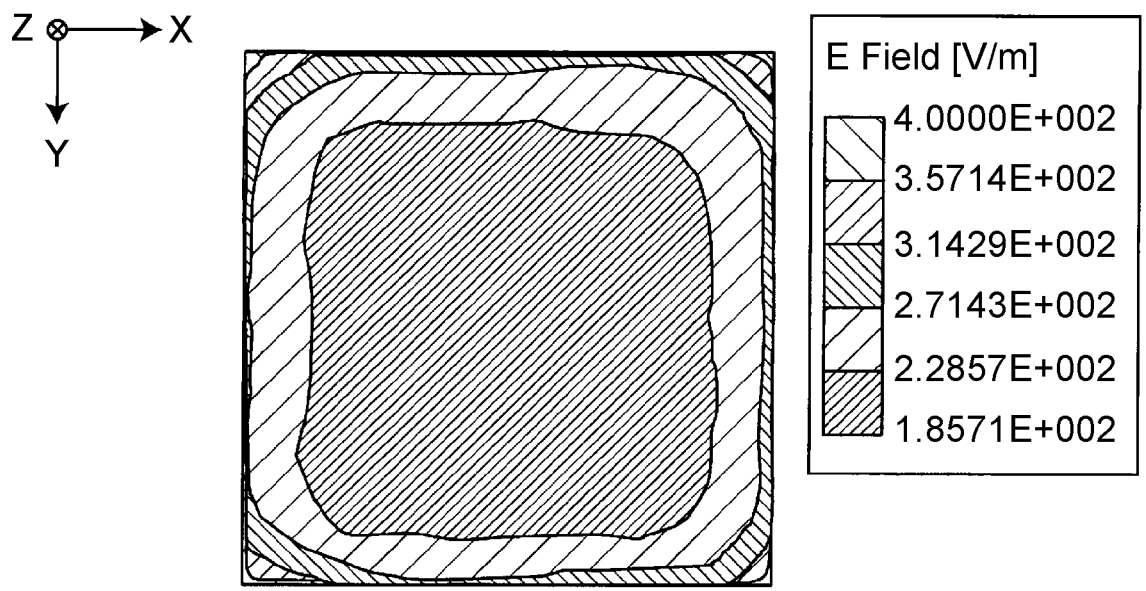
FIG. 6 is a schematic view of the electric field distribution on the top surface of a heating target object in Comparative Example 1.
Figure 7:
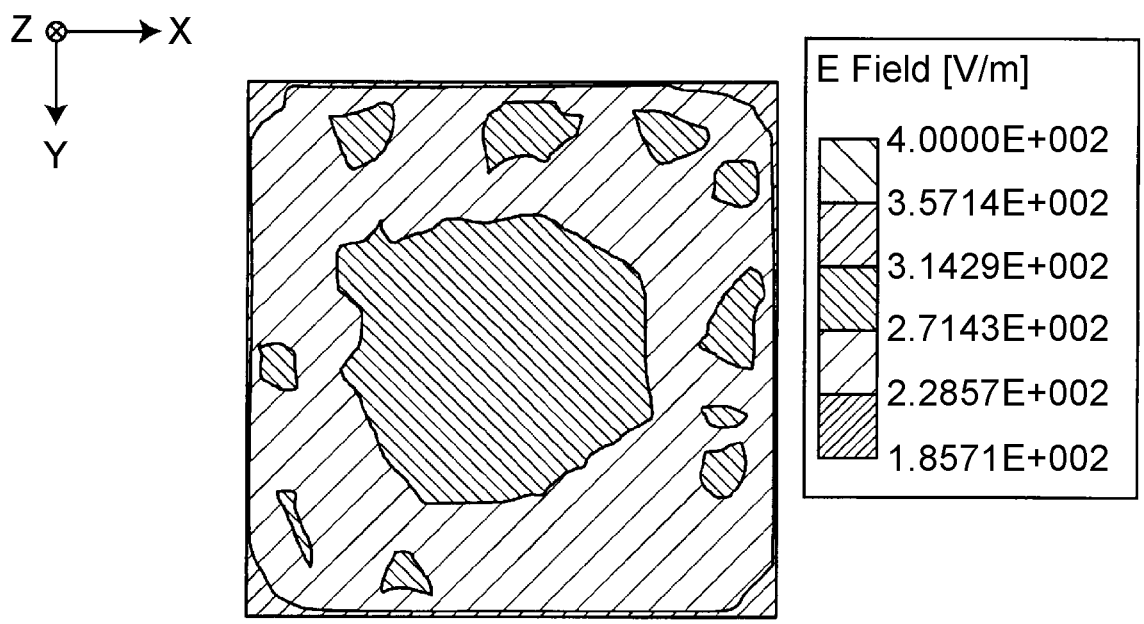
FIG. 7 is a schematic view of the electric field distribution on the top surface of a heating target object in Example 1.

FIG. 6 is a schematic view of the electric field distribution on the top surface of heating target object 90 in Comparative Example 1. FIG. 7 is a schematic view of the electric field distribution on the top surface of heating target object 90 in Example 1. As shown in FIG. 6, the electric field concentrates more around the peripheral parts of heating target object 90 than around the central part in Comparative Example 1. As shown in FIG. 7, the electric field is more uniformly distributed over the entire surface of heating target object 90 in Example 1 than in Comparative Example 1.

Figure 8:
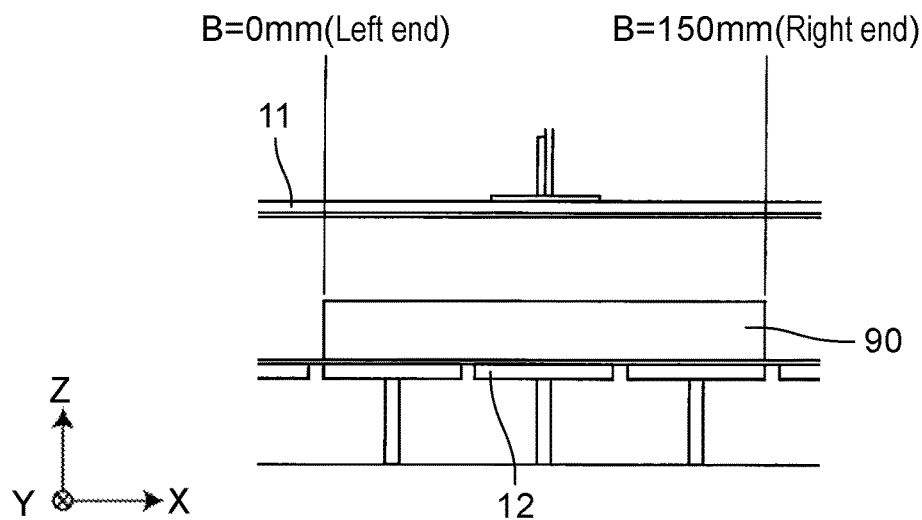
FIG. 8 shows the definition of the position of the heating target object along the width, which is used for the analysis of absorbed power distribution.

Next, the absorbed power distribution of heating target object 90 in Example 1 and Comparative Example 1 will now be described as follows. FIG. 8 shows the definition of the position of heating target object 90 along the width, which is used for the analysis of absorbed power distribution.

As shown in FIG. 8, B (mm) represents the position of heating target object 90 along the width or in the x-axis direction. Since the width of heating target object 90 is 150 mm as mentioned above, the position of B=0 mm is the left end of heating target object 90, and the position of B=150 mm is the right end of heating target object 90.

Figure 9:
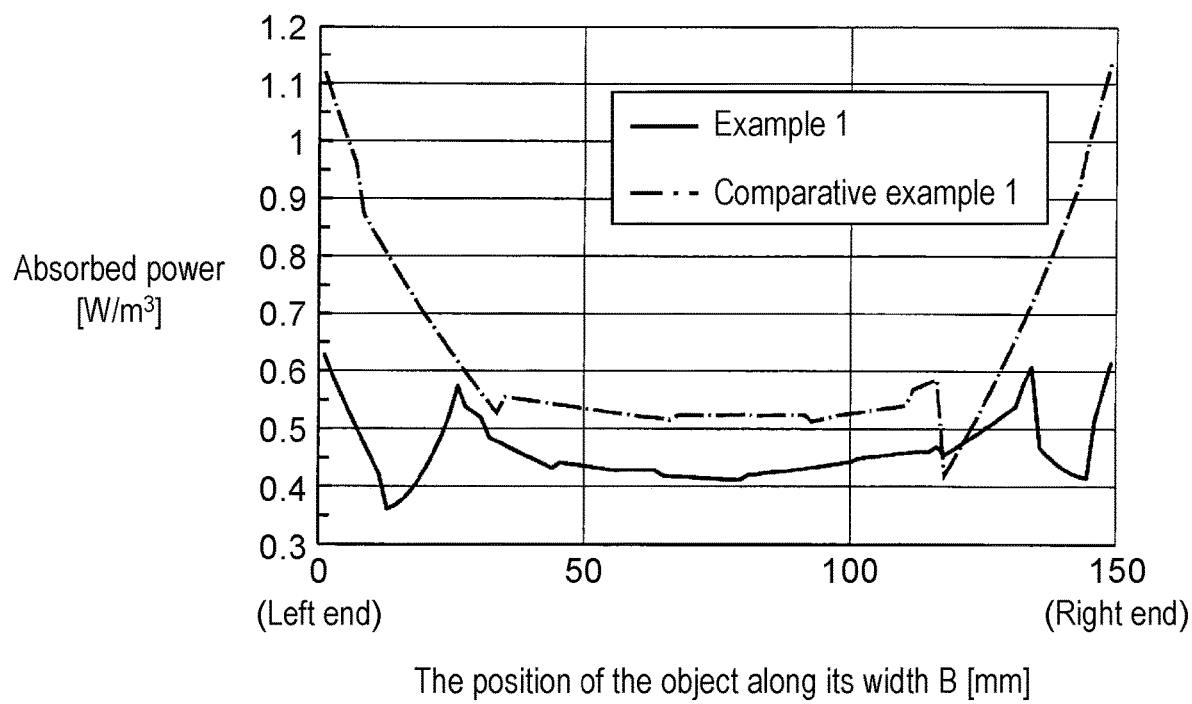
FIG. 9 is a graph showing the absorbed power distribution of the heating target object in Example 1 and Comparative Example 1.

FIG. 9 is a graph showing the absorbed power distribution of heating target object 90 in Example 1 and Comparative Example 1. As shown in FIG. 9, the absorbed power is higher around the left end (B=0 mm) and around the right end (B=150 mm) of heating target object 90 than around the center (B=mm) of heating target object 90 in Comparative Example 1.

In Example 1, the absorbed power is lower around the left and right ends of heating target object 90 than in Comparative Example 1. In Example 1, the absorbed power is not so high around the left and right ends of heating target object 90 as around the center of heating target object 90.

Thus, the absorbed power is lower around the left and right ends of heating target object 90 in Example 1 than in Comparative Example 1. In other words, heating target object 90 is heated more uniformly in Example 1.

Effects

High frequency heating apparatus 1A according to the present exemplary embodiment has the following effects.

Electric field regulator 50 includes switching units 51a, 51b, and 51c and impedance elements 52a, 52b, and 52c, which are placed between second electrodes 12 and the ground. Switching units 51a, 51b, and 51c perform switching between connecting second electrodes 12a, 12b, and 12c to the ground via impedance elements 52a, 52b, and 52c, respectively, and connecting these electrodes directly to the ground.

The present exemplary embodiment enables adjusting the impedances between second electrodes 12 and the ground. This enables individually adjusting the electric field strengths in the regions S1, S2, and S3 located between first electrode 11 and second electrodes 12.

Electric field regulator 50 turns on and off switching units 51a, 51b, and 51c, so that the second electrode 12 corresponding to the central region S2 of the regions S1, S2, and S3 is directly connected to the ground and that the second electrodes 12 corresponding to the non-central regions S1 and S3 are connected to the ground via impedance elements 52a and 52c, respectively.

The present exemplary embodiment enables preventing the electric field from concentrating around the peripheral parts of first electrode 11 and of second electrodes 12. This reduces variation in the strength of the electric field generated between first electrode 11 and second electrodes 12, thereby reducing uneven heating in heating target object 90, which has a uniform thickness.

Modified Example

In the present exemplary embodiment, first electrode 11 is rectangular, but may be, for example, circular, oval, or polygonal.

In the present exemplary embodiment, second electrodes 12 include second electrodes 12a, 12b, and 12c, but the number of second electrodes 12 is not limited to three.

In the present exemplary embodiment, all second electrodes 12 are rectangular, but alternatively, at least one of them may be, for example, circular, oval, or polygonal.

In the present exemplary embodiment, second electrodes 12 are placed in a matrix in the XY plane. Alternatively, however, second electrodes 12 may include a circular electrode placed in the center when viewed from above, and a plurality of electrodes surrounding the circular electrode.

In the present exemplary embodiment, second electrodes 12 are placed below first electrode 11, but may alternatively be placed above first electrode 11. Further alternatively, first electrode 11 and second electrodes 12 may be placed side by side. In other word, first electrode 11 and second electrodes 12 have only to be placed fact-to-face.

In the present exemplary embodiment, first electrode 11, second electrodes 12, and electric field regulator 50 are placed in heating chamber 13, but may alternatively be placed outside heating chamber 13.

In the present exemplary embodiment, high-frequency power supply 20 includes oscillator 21 and amplifiers 22 and 23 as shown in FIG. 2, but may further include other components as long as high-frequency power supply 20 can apply a high-frequency voltage.

In the present exemplary embodiment, matching unit 30 includes coils L1 and L2, and variable capacitance capacitors VC1 and VC2 as shown in FIG. 3, but may further include other components as long as matching unit 30 can be impedance-matched with high-frequency power supply 20.

In the present exemplary embodiment, controller 40 controls high-frequency power supply 20, but may further control electric field regulator 50 based on the information entered by the user.

In this case, the user may enter information containing a part of heating target object 90 that is to be heated heavily and a part of heating target object that is to be heated lightly using an input unit (not shown). Controller 40 turns on and off switching units 51a, 51b, and 51c based on the information received through the input unit. This structure can adjust the electric field strength based on the information entered by the user.

In the present exemplary embodiment, each one second electrode 12 is connected to one switching unit and one impedance element in electric field regulator 50. Alternatively, however, each one second electrode 12 may be connected to a plurality of switching units and a plurality of impedance elements.

This structure can adjust the electric field strength at multiple steps.

In the present exemplary embodiment, switching units 51a, 51b, and 51c perform switching between connecting second electrodes 12a, 12b, and 12c to the ground via impedance elements 52a, 52b, and 52c, respectively, and connecting these electrodes directly to the ground. However, the present disclosure is not limited to this structure.

The impedances between the ground and each of second electrodes 12a, 12b, and 12c have only to be adjusted by turning on and off switching units 51a, 51b, and 51c. For example, second electrode 12a may be connected to an impedance element having a different impedance from impedance element 52a by turning on and off switching unit 51a.

In the present exemplary embodiment, impedance elements 52a, 52b, and 52c are capacitors, but may be, for example, coils.

In the present exemplary embodiment, electric field regulator 50 includes switching units 51a, 51b, and 51c, but may not include these units.

Figure 10:
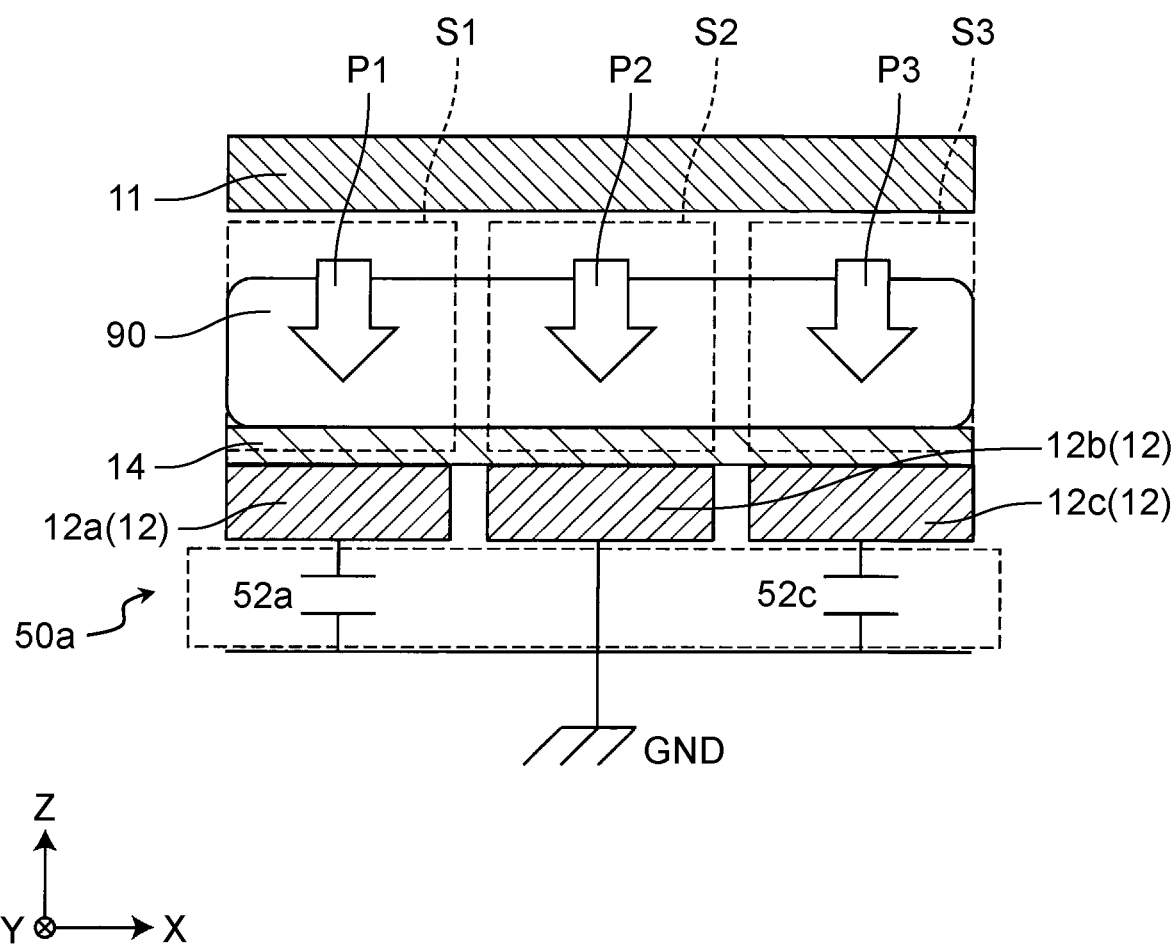
FIG. 10 is a schematic configuration of the electric field regulator in the modified example of the first exemplary embodiment.

FIG. 10 is a schematic configuration of electric field regulator 50a in the modified example of the first exemplary embodiment. As shown in FIG. 10, electric field regulator 50a does not include switching units. Regulator 50a connects the second electrode 12 corresponding to the central region S2 of the regions S1, S2, and S3 directly to the ground, and further connects the second electrodes 12 corresponding to the non-central regions S1 and S3 to the ground via impedance elements 52a and 52c, respectively.

Electric field regulator 50a of this modified example has effects similar to those of electric field regulator 50 of the present exemplary embodiment. In electric field regulator 50a, second electrode 12b located in the center is always grounded, but may alternatively be connected to the ground via an impedance element (not shown) having a lower impedance than impedance elements 52a and 52c.

In the present exemplary embodiment, electric field regulator 50 includes impedance elements 52a, 52b, and 52c, but these impedance elements may alternatively have stray capacitances. The impedance elements can be composed of stray capacitances that are generated either between second electrodes 12 and the ground or between second electrodes 12 and the wall surface of heating chamber 13 even if second electrodes 12 are not connected to anything. This structure can negate the need for impedance elements 52a, 52b, and 52c, thereby achieving low cost and space saving.

Second Exemplary Embodiment

High frequency heating apparatus 1B according to a second exemplary embodiment of the present disclosure will now be described as follows. The present exemplary embodiment will be described, focusing mainly on features absent in the first exemplary embodiment. In the present exemplary embodiment, components identical to those in the first exemplary embodiment will be denoted by the same reference numerals, and the same description will not be repeated.

Figure 11:
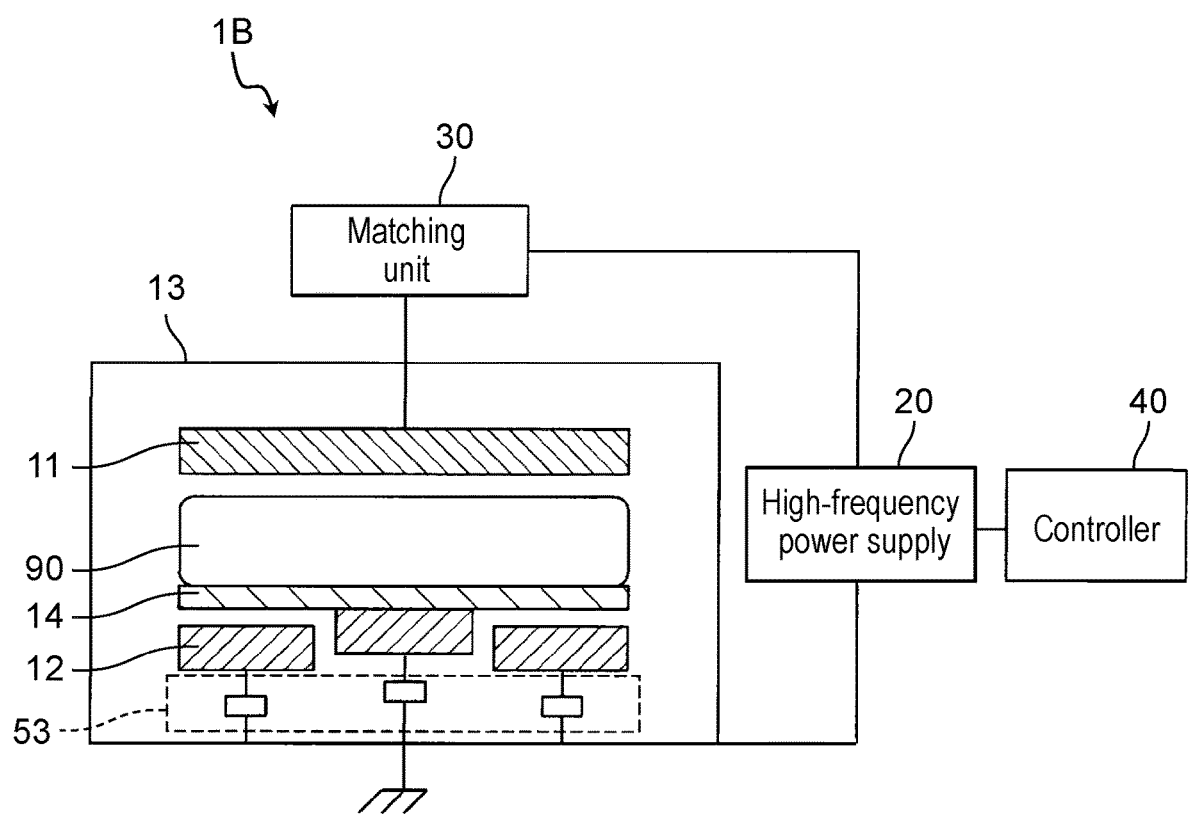
FIG. 11 is a schematic configuration of a high frequency heating apparatus according to a second exemplary embodiment of the present disclosure.
Figure 12:
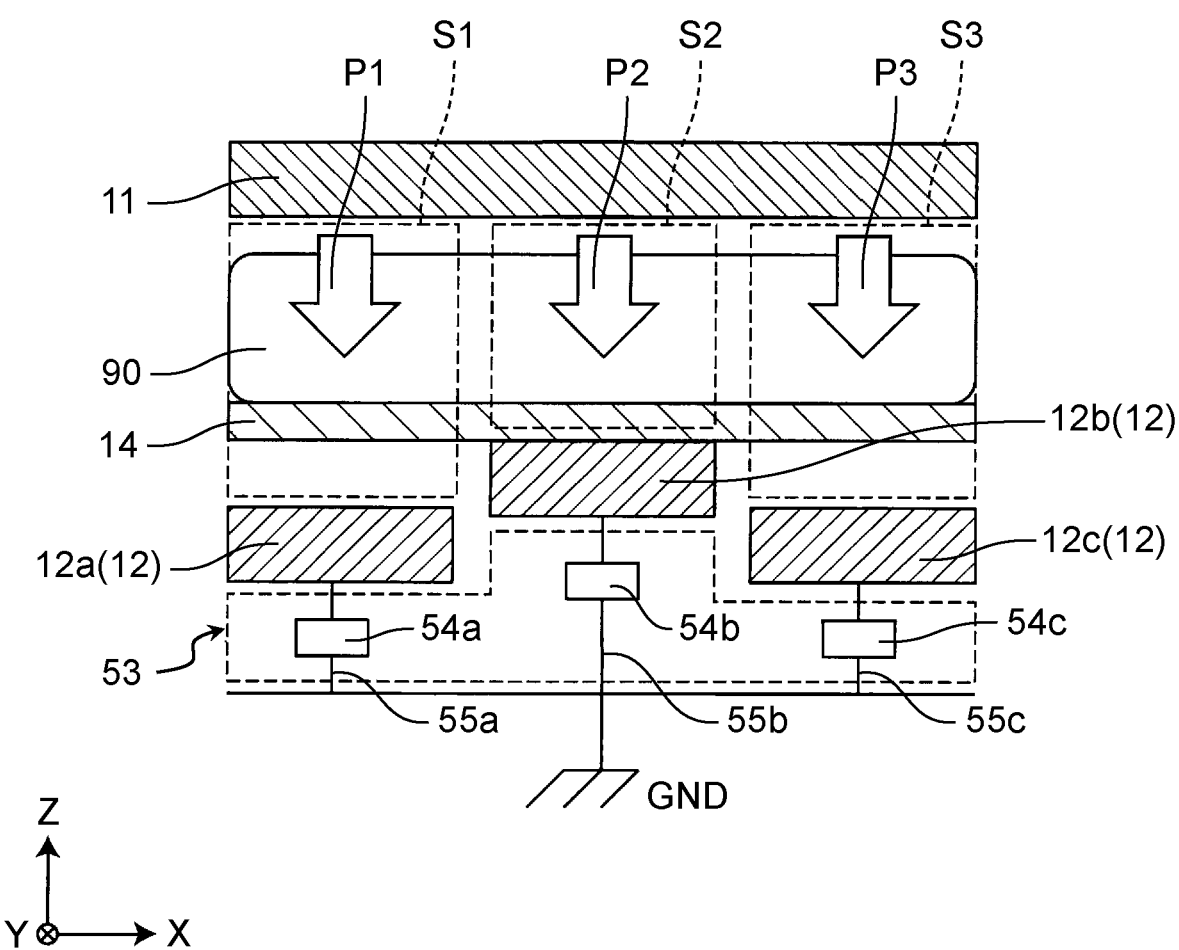
FIG. 12 is a schematic configuration of an electric field regulator in the second exemplary embodiment of the present disclosure.

FIG. 11 is a schematic configuration of high frequency heating apparatus 1B. FIG. 12 is a schematic configuration of electric field regulator 53 in the present exemplary embodiment. As shown in FIGS. 11 and 12, the present exemplary embodiment differs from the first exemplary embodiment in that electric field regulator 53 can adjust the spacing between first electrode 11 and each of second electrodes 12.

Electric Field Regulator

Electric field regulator 53 includes movable units 54a, 54b, and 54c that respectively connect second electrodes 12a, 12b, and 12c to the ground.

Movable units 54a, 54b, and 54c move second electrodes 12a, 12b, and 12c, respectively in the direction perpendicular to first electrode 11. In the present exemplary embodiment, movable units 54a, 54b, and 54c respectively move second electrodes 12a, 12b, and 12c along the height of apparatus 1B, that is, in the z direction.

Movable units 54a, 54b, and 54c include bar-shaped members 55a, 55b, and 55c, respectively, whose lengths are adjustable. Movable units 54a, 54b, and 54c adjust the lengths of bar-shaped members 55a, 55b, and 55c, respectively, so as to move second electrodes 12a, 12b, and 12c.

For example, extending the lengths of bar-shaped members 55a, 55b, and 55c results in moving second electrodes 12a, 12b, and 12c closer to first electrode 11. Meanwhile, shortening the lengths of bar-shaped members 55a, and 55c results in moving second electrodes 12a, 12b, and 12c away from first electrode 11.

This structure can change the spacings between first electrode 11 and second electrodes 12a, 12b, and 12c, thereby individually adjusting the strength of the electric field generated between first electrode 11 and second electrodes 12a, 12b, and 12c.

More specifically, when movable unit 54a moves second electrode 12a closer to first electrode 11, the electric field strength P1 between these electrodes becomes higher. Meanwhile when movable unit 54a moves second electrode 12a away from first electrode 11, the electric field strength P1 between these electrodes becomes lower. Thus, movable unit 54a adjusts the electric field strength P1 in the region S1 located between first electrode 11 and second electrode 12a.

Similarly, movable unit 54b adjusts the electric field strength P2 in the region S2 located between first electrode 11 and second electrode 12b. Movable unit 54c adjusts the electric field strength P3 in the region S3 located between first electrode 11 and second electrode 12c.

In the present exemplary embodiment, electric field regulator 53 makes the spacing between first electrode 11 and second electrode 12b corresponding to the central region S2 of the regions S1, S2, and S3 shorter than the spacing between first electrode 11 and second electrodes 12a and 12c corresponding to the non-central regions S1 and S3, respectively. This can equalize the electric field strengths P1, P2, and P3.

Effects

High frequency heating apparatus 1B according to the second exemplary embodiment has the following effects.

Electric field regulator 53 controls movable units 54a, 54b, and 54c so that the spacing between first electrode 11 and second electrode 12b corresponding to the central region S2 is shorter than the spacing between first electrode 11 and second electrodes 12a and 12b corresponding to the non-central regions S1 and S3, respectively.

This structure can prevent the electric field from concentrating around the peripheral parts of first electrode 11 and of second electrodes 12. This results in reducing variations in the strength of the electric field generated between first electrode 11 and second electrodes 12, thereby reducing uneven heating of heating target object 90, which has a uniform thickness.

Modified Example

Figure 13:
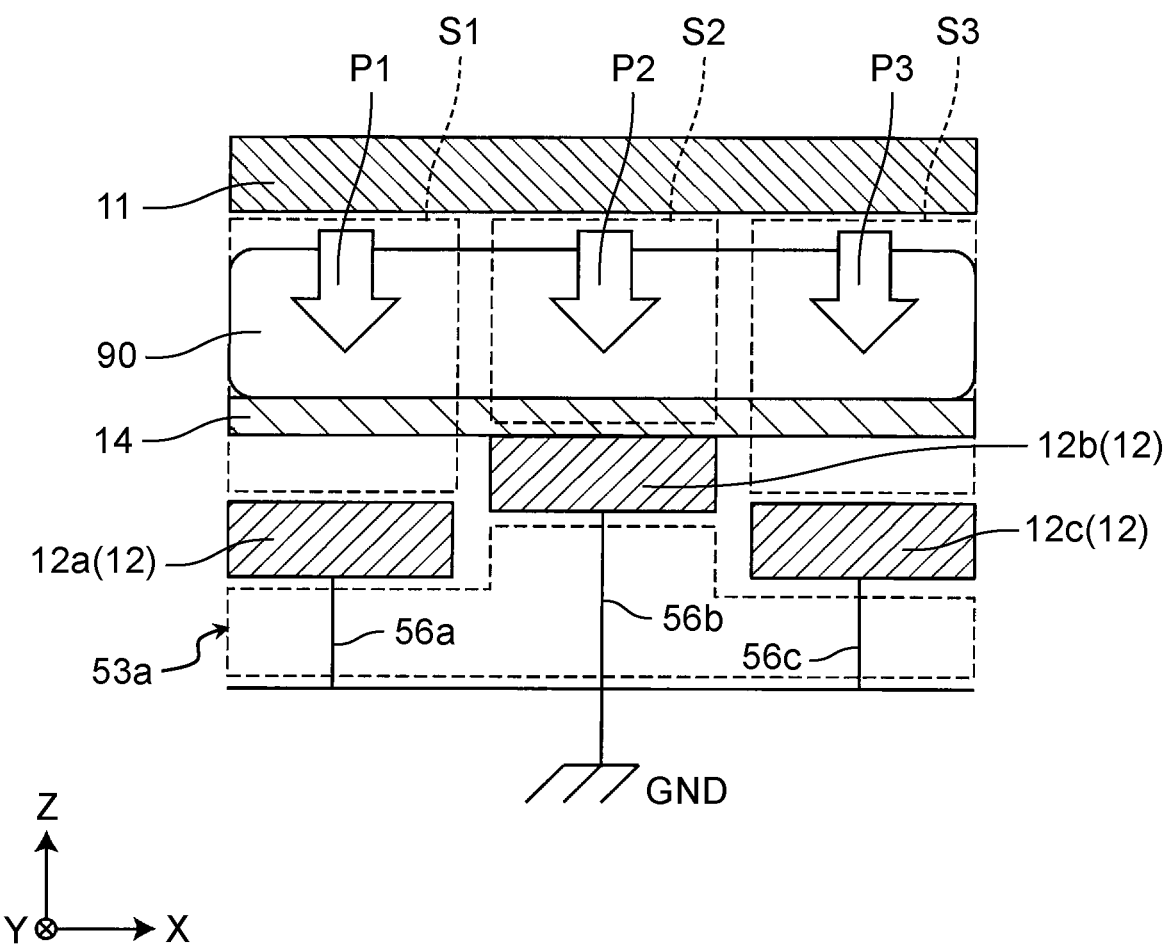
FIG. 13 is a schematic configuration of an electric field regulator in the modified example of the second exemplary embodiment.

FIG. 13 is a schematic configuration of electric field regulator 53a in the modified example of the present exemplary embodiment. As shown in FIG. 13, electric field regulator 53a includes bar-shaped members 56a, 56b, and 56c that have a predetermined length and connect second electrodes 12 and the ground.

More specifically, bar-shaped member 56b for grounding second electrode 12b is longer than bar-shaped members 56a and 56c for grounding second electrodes 12a and 12c, respectively. This modified example has effects similar to those of electric field regulator 53 of the present exemplary embodiment.

Electric field regulator 53a may include a plurality of second electrodes 12 different in thickness instead of bar-shaped members 56a, 56b, and 56c. More specifically, making second electrode 12b thicker than second electrodes 12a and 12c results in making the spacing between second electrode 12b and first electrode 11 shorter than the spacing between first electrode 11 and each of second electrodes 12a and 12c. This modified example has effects similar to those of electric field regulator 53 of the present exemplary embodiment.

Third Exemplary Embodiment

High frequency heating apparatus 1C according to a third exemplary embodiment of the present disclosure will be described as follows. The present exemplary embodiment will be described, focusing mainly on features absent in the first exemplary embodiment. In the present exemplary embodiment, components identical to those in the first exemplary embodiment will be denoted by the same reference numerals, and the same description will not be repeated.

Figure 14:
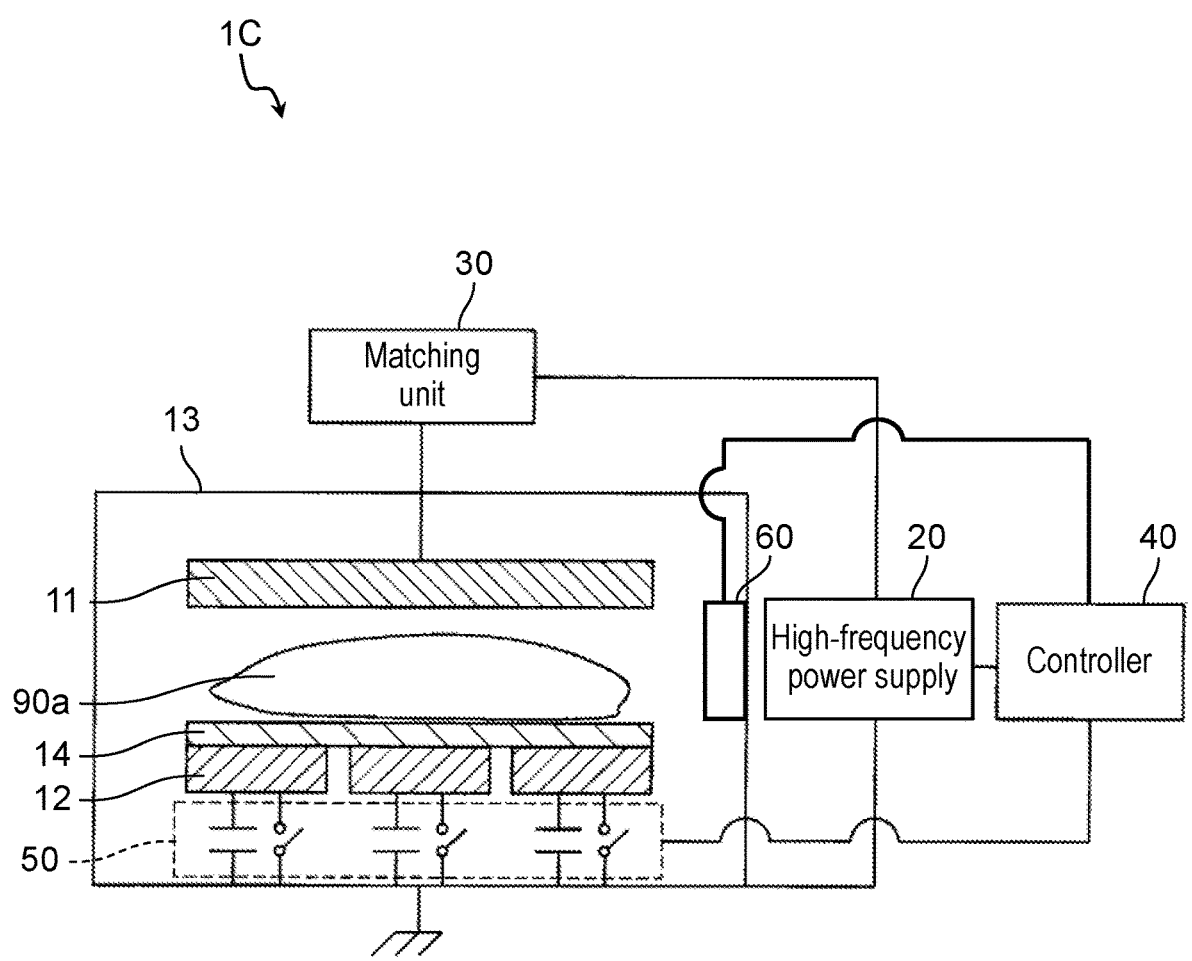
FIG. 14 is a schematic configuration of a high frequency heating apparatus according to a third exemplary embodiment of the present disclosure.

FIG. 14 is a schematic configuration of high frequency heating apparatus 1C. As shown in FIG. 14, the present exemplary embodiment differs from the first exemplary embodiment in the following features: including detector 60, controller 40 controlling electric field regulator 50, and heating target object 90a having a non-uniform thickness.

Detector

Detector 60 is placed on the side wall of heating chamber 13 at a height between first electrode 11 and second electrodes 12. Detector 60, which detects the shape of heating target object 90a that is placed between first electrode 11 and second electrodes 12, can be a camera, an ultrasonic sensor, or the like.

Controller

Controller 40 receives information about the shape of heating target object 90a detected by detector 60. Controller 40 then controls electric field regulator 50 based on the shape of heating target object 90a.

Figure 15:
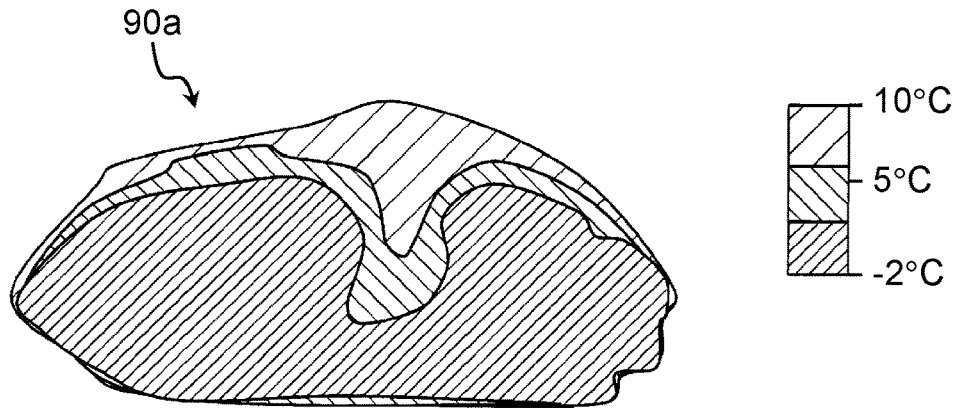
FIG. 15 is a schematic view of the temperature distribution of a heating target object when the heating target object is heated using the unadjusted strength of the electric field in the high frequency heating apparatus according to the third exemplary embodiment.

FIG. 15 is a schematic view of the temperature distribution of heating target object 90a when heating target object 90a is heated using the unadjusted strength of the electric field in high frequency heating apparatus 1C. This analysis uses a beef block as heating target object 90a. After being heated, heating target object 90a is cut lengthwise into two parts, and the cross section is measured for the temperature distribution using a thermo viewer.

As shown in FIG. 15, the thicker part of heating target object 90a around its center is higher in temperature than around the peripheral parts. This indicates that the electric field concentrates more in the thicker part than in the thinner parts.

Controller 40 identifies the thicker part and the thinner parts of heating target object 90a based on the shape of heating target object 90a. Controller controls electric field regulator 50 so as to reduce the electric field strength in the region containing the thicker part of heating target object 90a, of the plurality of regions located between first electrode 11 and second electrodes 12. Controller 40 further controls electric field regulator 50 so as to increase the strength of the electric field in the regions containing the thinner parts of heating target object 90a.

Figure 16:
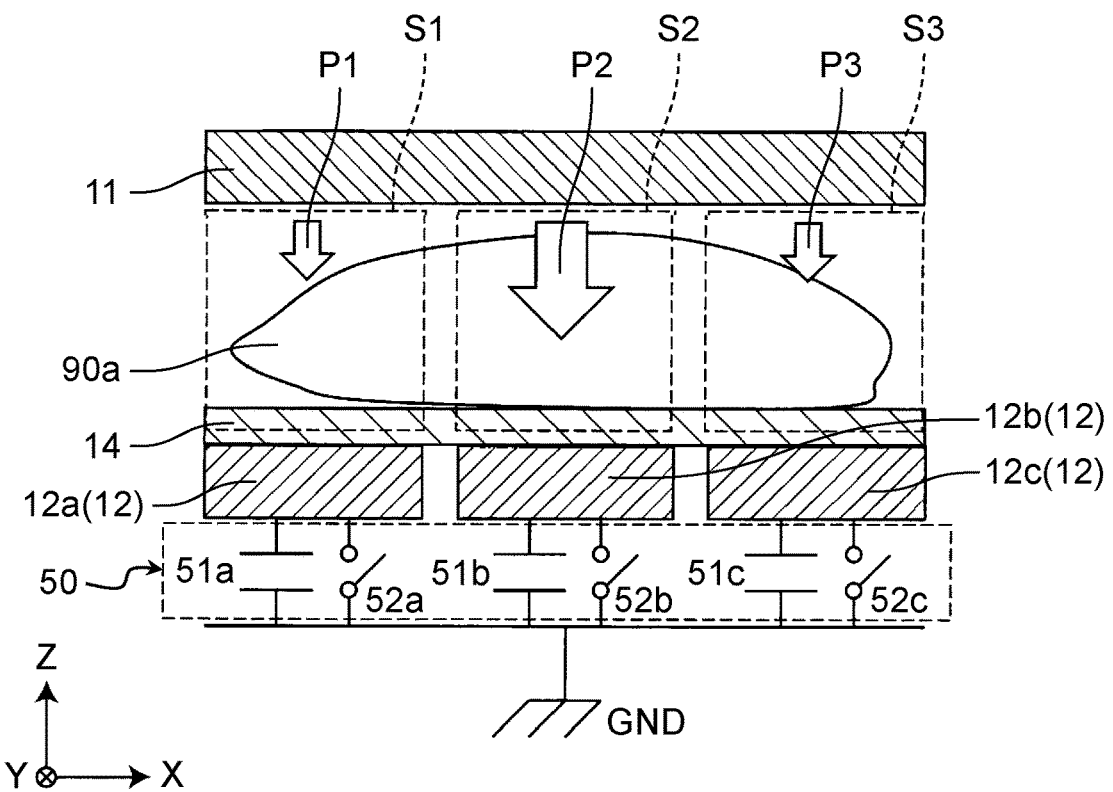
FIG. 16 is a schematic view when the heating target object is heated using the unadjusted strength of the electric field in the high frequency heating apparatus according to the third exemplary embodiment.

FIG. 16 is a schematic view when heating target object 90a is heated using the unadjusted strength of the electric field in high frequency heating apparatus 1C. As shown in FIG. 16, when heating target object 90a is heated using the unadjusted strength of the electric field, the electric field strength P2 in the central region S2 becomes greater than the electric field strengths P1 and P3 in the peripheral regions S1 and S3.

Figure 17:
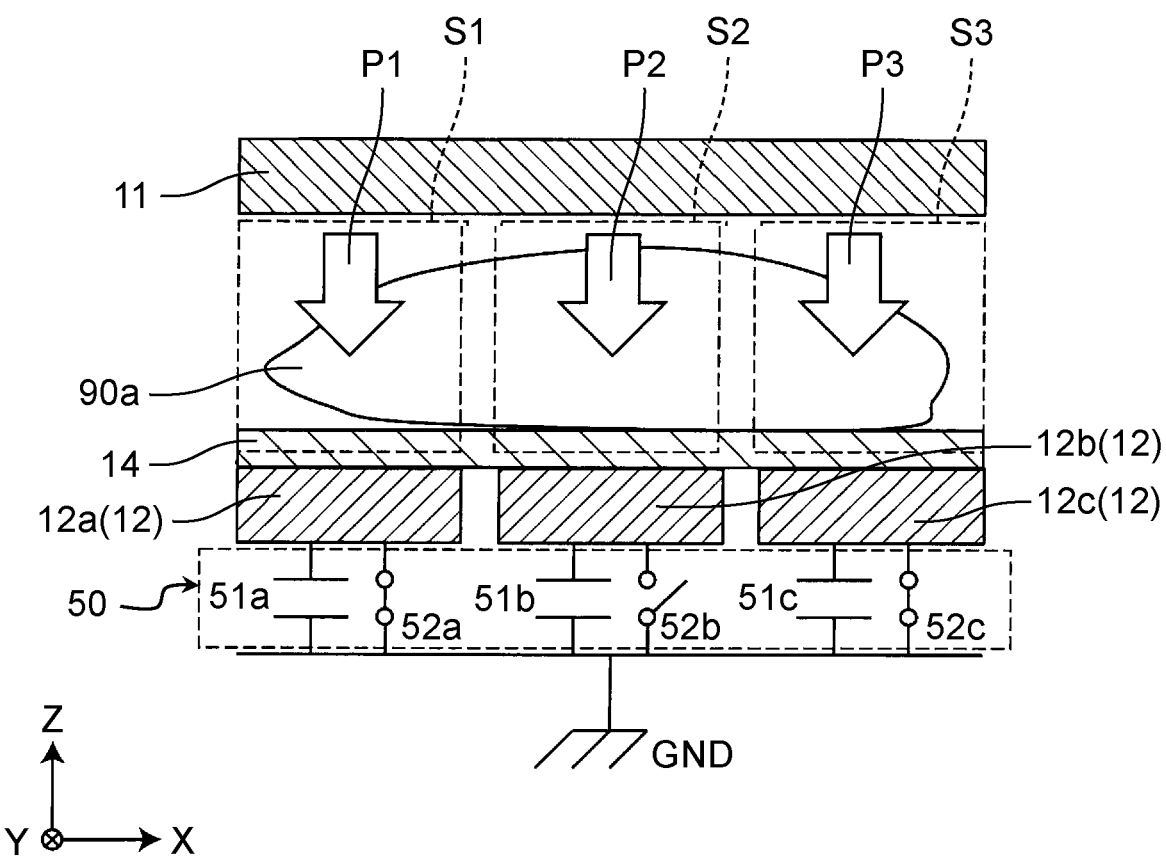
FIG. 17 is a schematic view when the heating target object is heated using the adjusted strength of the electric field in the high frequency heating apparatus according to the third exemplary embodiment.

FIG. 17 is a schematic view when heating target object 90a is heated using the adjusted strength of the electric field in high frequency heating apparatus 1C.

As shown in FIG. 17, controller 40 turns off switching unit 51b corresponding to the region S2 containing the thicker part of heating target object 90a, of the regions S1, S2, and S3. Controller 40 further turns on switching units 51a and 51c, which respectively correspond to the regions S1 and S3 containing the thinner parts of heating target object 90a, of the regions S1, S2, and S3.

This can equalize the electric field strengths P1 and P3 in the regions S1 and S3 containing the thinner parts of heating target object 90a and the electric field strength P2 in the region S2 containing the thicker part of heating target object 90a. This reduces uneven heating of heating target object 90a, which has a non-uniform thickness.

Analysis of High Frequency Heating Apparatus 1C

Analysis of electric field distribution in high frequency heating apparatus 1C will now be described as follows. This analysis is performed using an analysis model of high frequency heating apparatus 1C and a HFSS produced by ANSYS Corporation.

Figure 18:
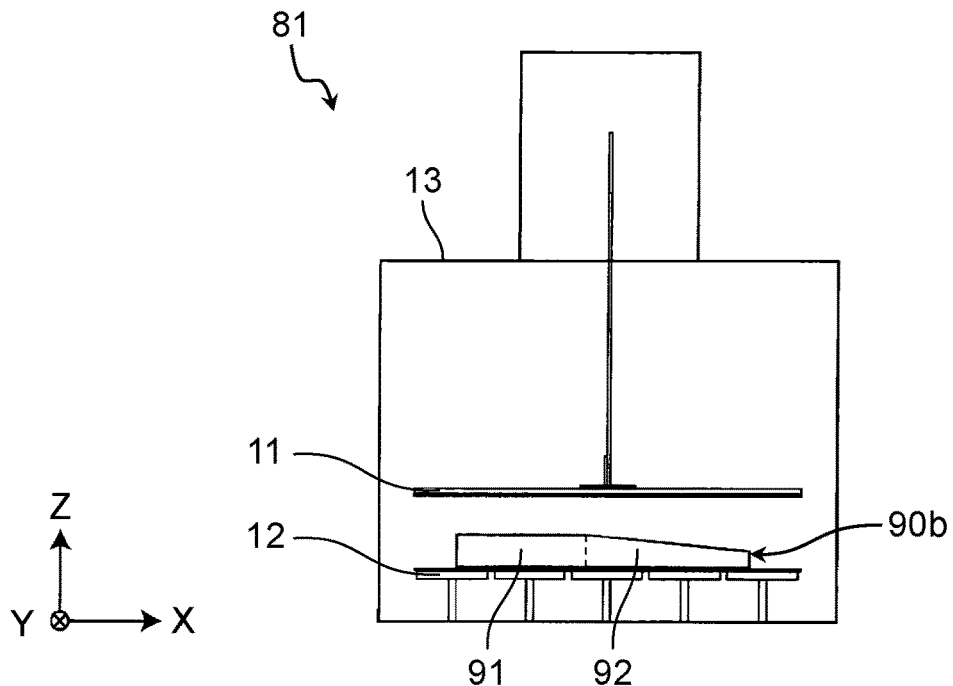
FIG. 18 is a schematic front view of an analysis model used for the analysis of electric field distribution.

FIG. 18 is a schematic front view of analysis model 81 used for the analysis of electric field distribution. As shown in FIG. 18, analysis model 81 is derived from high frequency heating apparatus 1C. Heating chamber 13, first electrode 11, and second electrodes 12 in analysis model 81 are identical to the counterparts in analysis model 80. This analysis uses heating target object which is rectangular when viewed from above.

Heating target object 90b includes flat part 91 having a constant thickness, and inclined part 92 where the top surface of heating target object is inclined downward in the positive direction of the x axis, becoming gradually thinner. Heating target object 90b has dimensions of 200 mm wide× 200 mm deep×20 mm high at maximum. Flat part 91 has dimensions of 85 mm wide×200 mm deep×20 mm high. Inclined part 92 has dimensions of 115 mm wide×200 mm deep, and its thickness gradually decreases from 20 mm to 10 mm.

The results of the analysis of electric field distribution performed using analysis model 81 will now be described as follows. The results of the analysis performed with the adjusted strength of the electric field will be described as Example 2. The results of the analysis performed with the unadjusted strength of the electric field will be described as Comparative Example 2, which is compared with Example 2.

In Example 2, of the plurality of regions located between first electrode 11 and second electrodes 12, second electrodes 12 corresponding to the region containing inclined part 92 and second electrode 12 corresponding to the central region are directly connected to the ground, whereas second electrodes 12 corresponding to the other regions are connected to the ground via the impedance elements. In Comparative Example 2, all second electrodes 12 are connected to the ground via the impedance elements.

Figure 19:
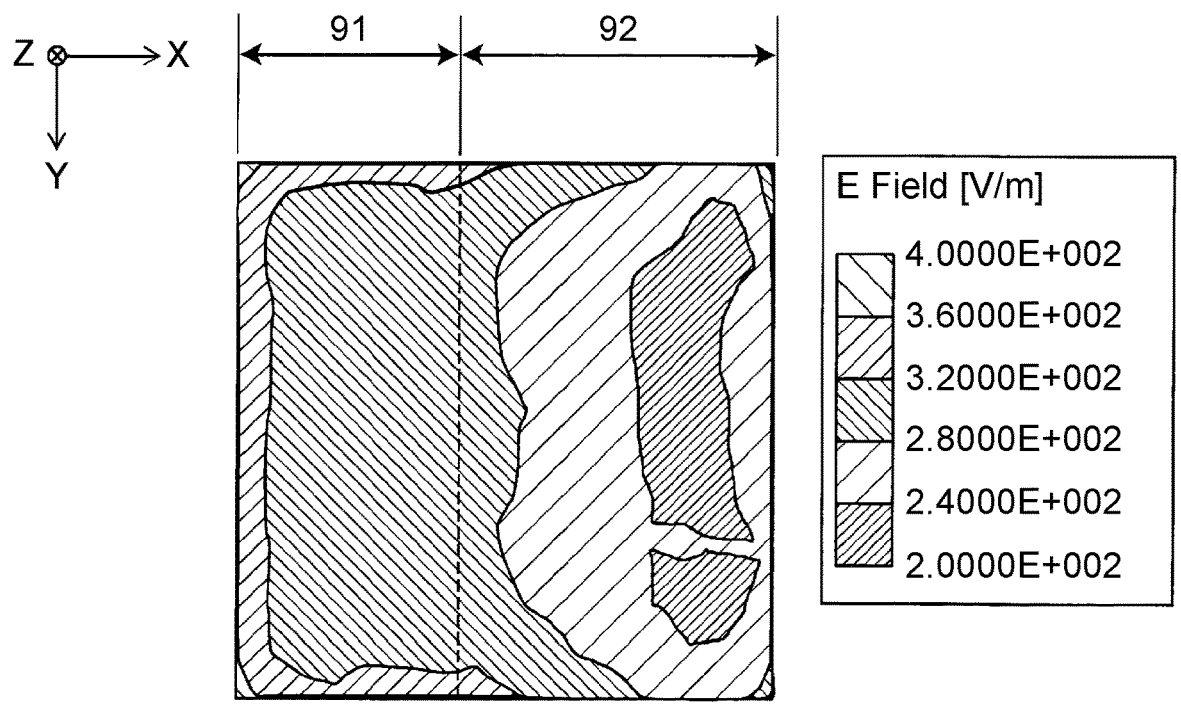
FIG. 19 is a schematic view of the electric field distribution on the top surface of a heating target object in Comparative Example 2.
Figure 20:
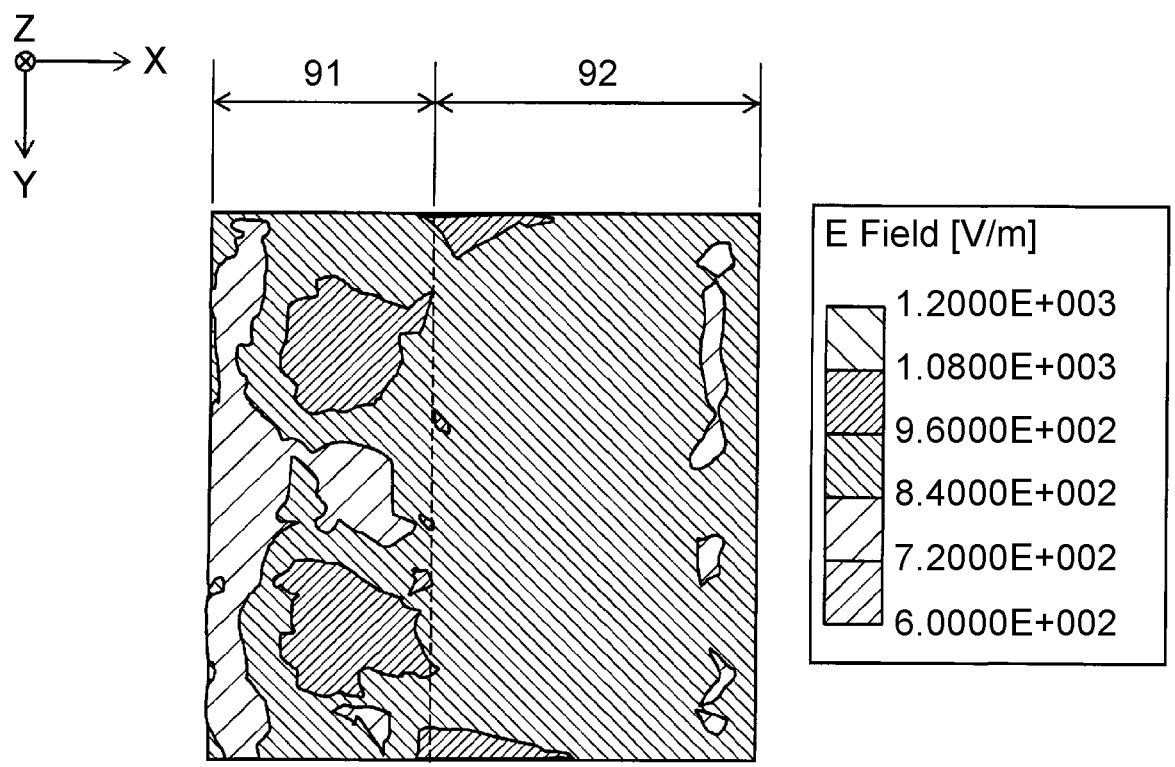
FIG. 20 is a schematic view of the electric field distribution on the top surface of a heating target object in Example 2.

FIG. 19 is a schematic view of the electric field distribution on the top surface of heating target object 90 in Comparative Example 2. FIG. 20 is a schematic view of the electric field distribution on the top surface of heating target object 90 in Example 2. As shown in FIG. 19, the electric field concentrates in flat part 91 in Comparative Example 2. As shown in FIG. 20, the electric field is less concentrated in flat part 91 and distributed more uniformly over the entire surface of heating target object 90b in Example 2 than in Comparative Example 2.

Figure 21:
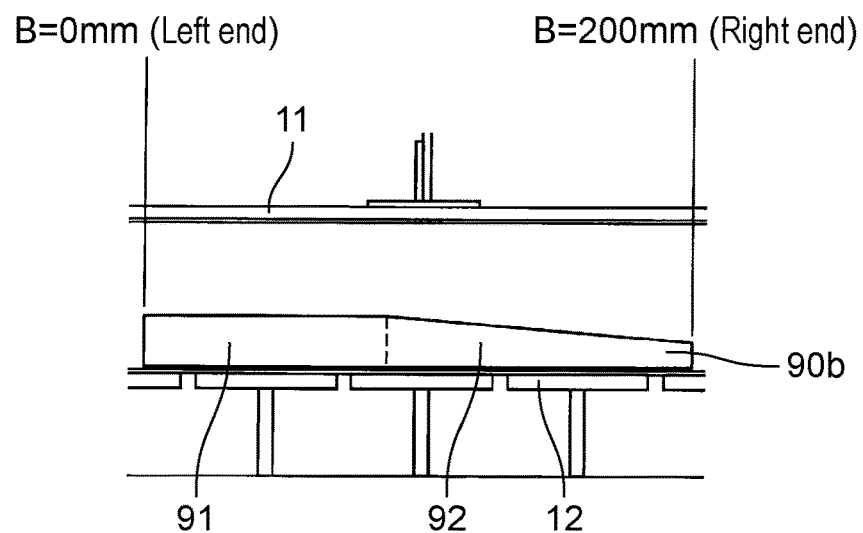
FIG. 21 shows the definition of the position of the heating target object along the width, which is used for the analysis of absorbed power distribution.

Next, the absorbed power distribution of heating target object 90b in Example 2 and Comparative Example 2 will now be described as follows. FIG. 21 shows the definition of the position of heating target object 90b along the width, which is used for the analysis of absorbed power distribution.

In FIG. 21, similar to FIG. 8, B (mm) represents the position of heating target object 90b along the width or in the x-axis direction. Since the width of heating target object 90b is 200 mm as mentioned above, the position of B=0 mm is the left end of heating target object 90b, and the position of B=200 mm is the right end of heating target object 90b. Flat part 91 is placed on the left whereas inclined part 92 is placed on the right.

Figure 22:
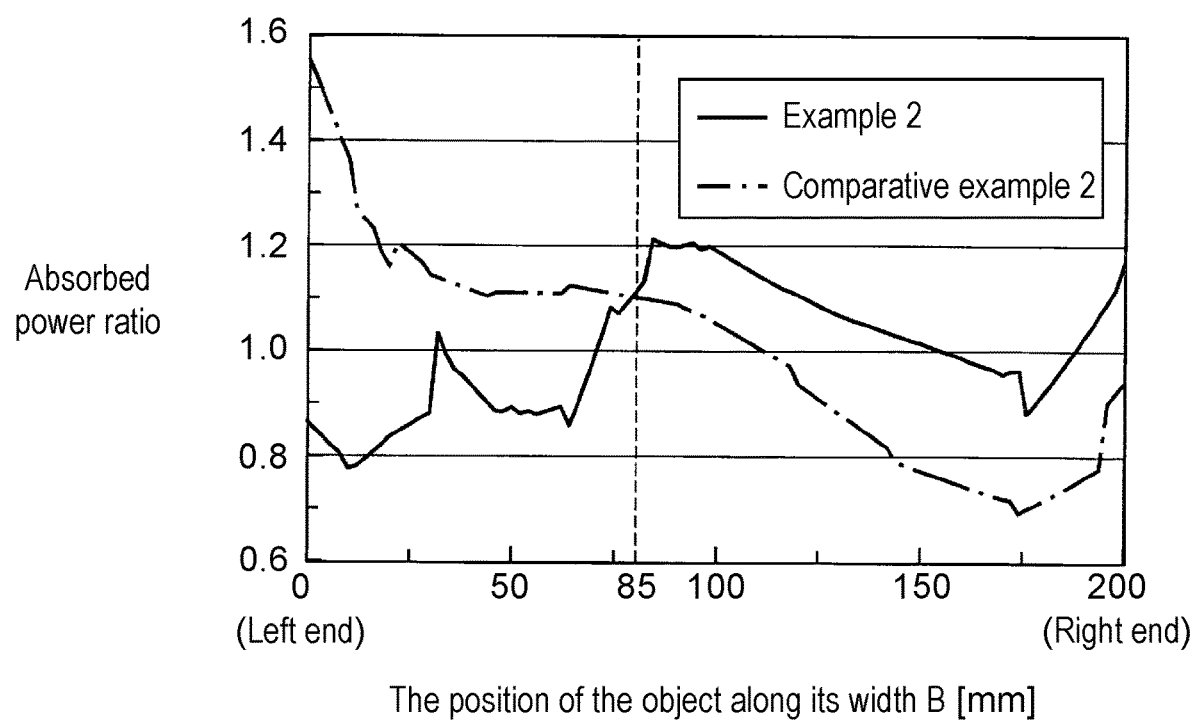
FIG. 22 is a graph showing the absorbed power distribution of the heating target object in Example 2 and Comparative Example 2.

FIG. 22 is a graph showing the absorbed power distribution of heating target object 90b in Example 2 and Comparative Example 2. In this analysis, the impedance matching with the load differs between Example 2 and Comparative Example 2, so that the vertical axis in FIG. 22 represents the absorbed power ratio calculated by the formula shown below.

(Absorbed power ratio)=(The absorbed power of each position)/(The average of the absorbed powers)

In FIG. 22, the positions from B=0 mm to B=85 mm correspond to flat part 91 of heating target object 90b, and the positions from B=85 mm to B=200 mm correspond to inclined part 92 of heating target object 90b. As shown in FIG. 22, the absorbed power ratio in flat part 91 is greater than that of inclined part 92 in Comparative Example 2.

More specifically, in Comparative Example 2, the electric field concentrates in flat part 91, so that inclined part 92 has a low electric field strength. In Example 2, the absorbed power ratio in inclined part 92 is greater than in Comparative Example 2, whereas the absorbed power ratio in flat part 91 is smaller than in Comparative Example 2.

Thus, inclined part 92, which is thinner than flat part 91, has a greater absorbed power ratio in Example 2 than in Comparative Example 2. More specifically, controlling electric field regulator 50 based on the shape of heating target object 90b can reduce uneven heating of heating target object 90b, which has a non-uniform thickness.

Effects

High frequency heating apparatus 1C of the present exemplary embodiment has the following effects.

Controller 40 controls switching units 51a and 51c so as to increase the electric field strength in the regions S1 and S3 corresponding to the thinner parts of heating target object 90a between first electrode 11 and second electrodes 12.

Controller 40 further controls switching unit 51b so as to reduce the electric field strength in the region S2 corresponding to the thicker part of heating target object 90a between first electrode 11 and second electrodes 12. This reduces uneven heating of heating target object 90a, which has a non-uniform thickness.

Modified Example

Controller 40 may control electric field regulator 50 based not on the detection results of detector 60 but on the information entered by the user. For example, the user can operate the input unit and specify the part to be heated heavily and the part to be heated lightly of heating target object 90a. In this case, controller 40 can control the on-off of switching units 51a, 51b, and 51c of electric field regulator 50 based on the information entered to the input unit. This enables adjusting the electric field strength based on the information entered by the user.

Fourth Exemplary Embodiment

High frequency heating apparatus 1D according to a fourth exemplary embodiment of the present disclosure will now be described as follows. The present exemplary embodiment will be described, focusing mainly on features absent in the third exemplary embodiment. In the present exemplary embodiment, components identical to those in the third exemplary embodiment will be denoted by the same reference numerals, and the same description will not be repeated.

Figure 23:
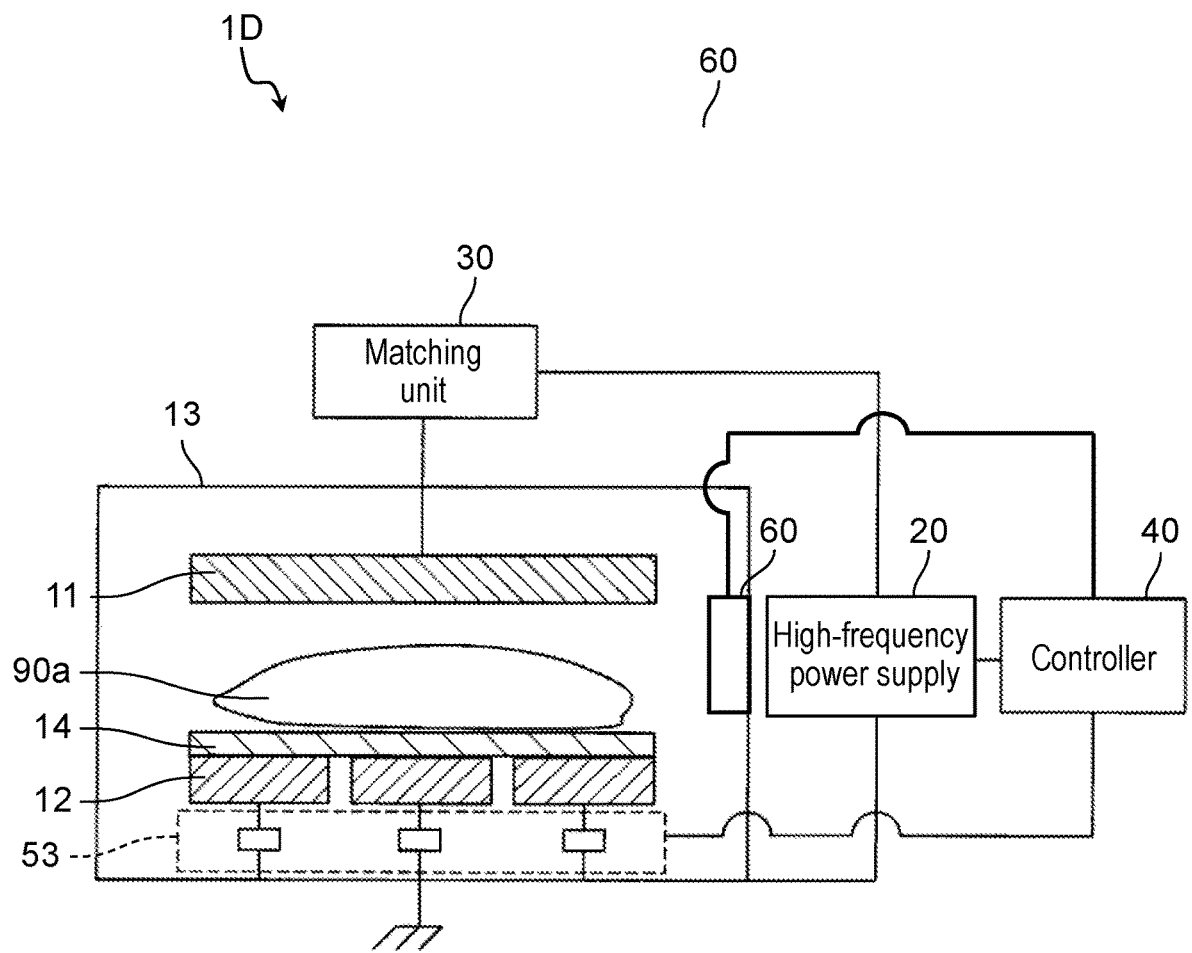
FIG. 23 is a schematic configuration of a high frequency heating apparatus according to a fourth exemplary embodiment of the present disclosure.
Figure 24:
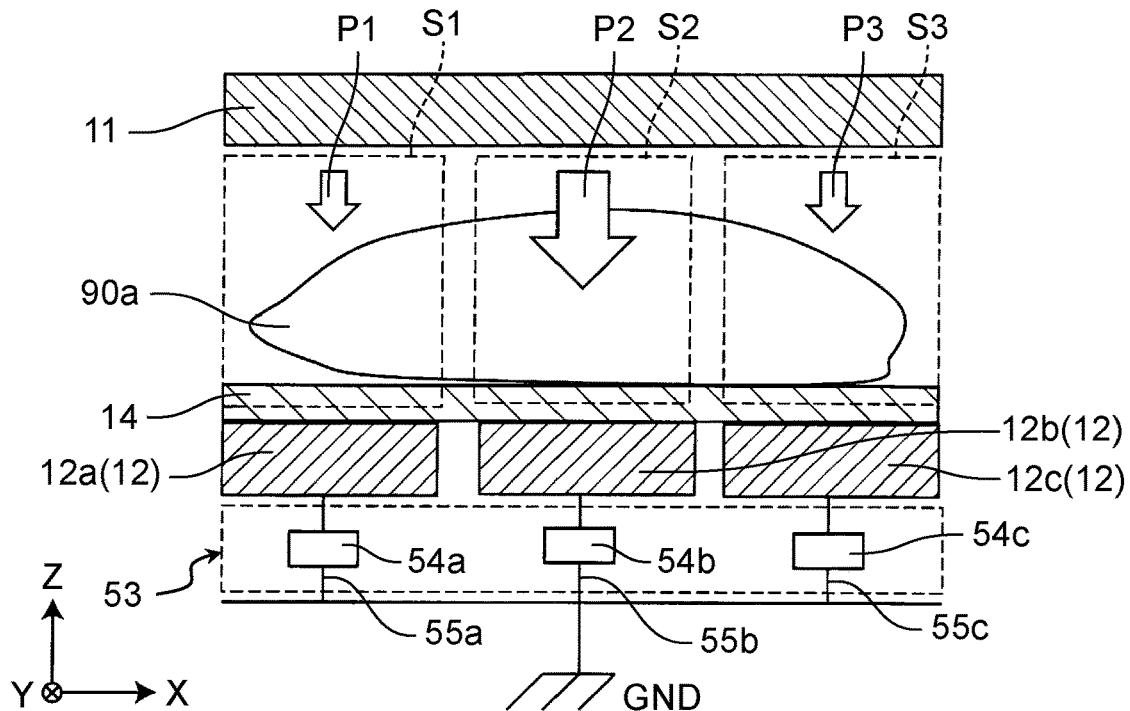
FIG. 24 is a schematic view when a heating target object is heated using the unadjusted strength of the electric field in the high frequency heating apparatus according to the fourth exemplary embodiment of the present disclosure.

FIG. 23 is a schematic configuration of a high frequency heating apparatus 1D. As shown in FIG. 23, the present exemplary embodiment differs from the third exemplary embodiment in having electric field regulator 53 described in the second exemplary embodiment instead of electric field regulator Controller FIG. 24 is a schematic view when heating target object 90a is heated using the unadjusted strength of the electric field in high frequency heating apparatus 1D. As shown in FIG. 24, when heating target object 90a is heated using the unadjusted strength of the electric field, the electric field strengths P1 and P3 in the peripheral regions S1 and S3 become greater than the electric field strength P2 in the central region S2.

Figure 25:
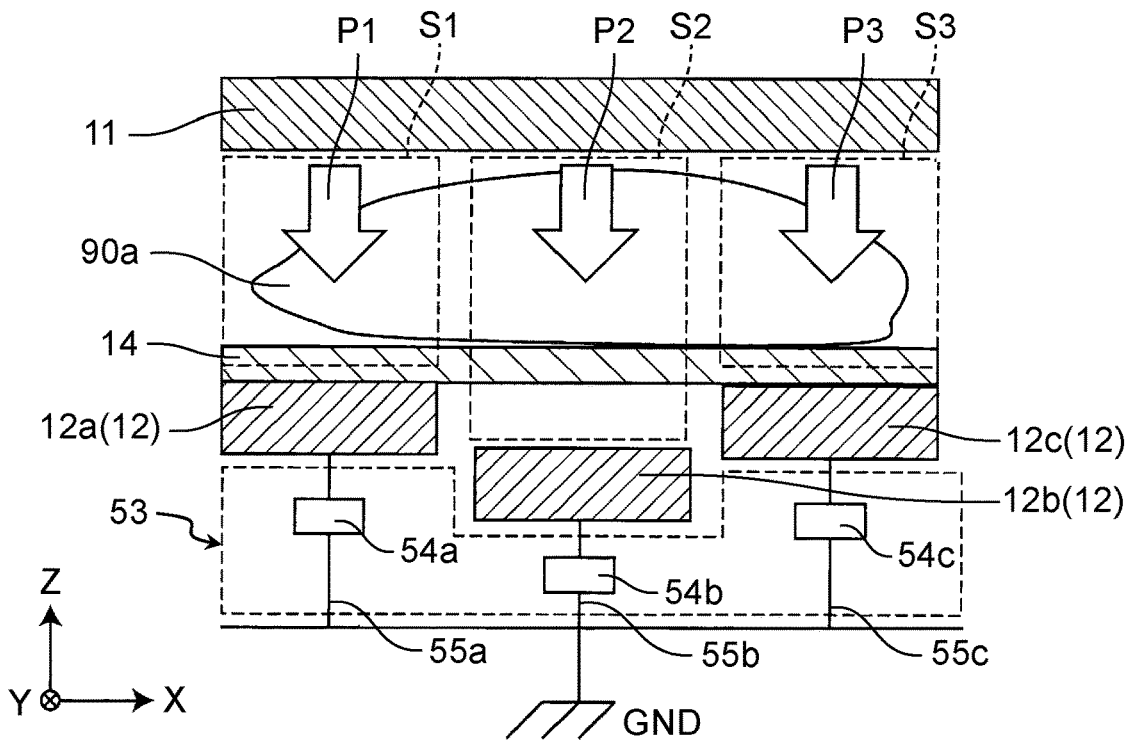
FIG. 25 is a schematic view when the heating target object is heated using the adjusted strength of the electric field in the high frequency heating apparatus according to the fourth exemplary embodiment of the present disclosure.

FIG. 25 is a schematic view when heating target object 90a is heated using the adjusted strength of the electric field in high frequency heating apparatus 1D.

As shown in FIG. 25, controller 40 controls electric field regulator 53 based on the shape of heating target object 90a so that second electrode 12b corresponding to the central region S2 is more away from first electrode 11 than second electrodes 12a and 12c corresponding to the non-central regions S1 and S3.

This makes the spacing between first electrode 11 and second electrodes 12a and 12c shorter than the spacing between first electrode 11 and second electrode 12b. As a result, the electric field strengths P1 and P3 in the regions S1 and S3 can be equalized with the electric field strength P2 in the region S2 containing the thicker part of heating target object 90a. This results in reducing uneven heating of heating target object 90a, which has a non-uniform thickness.

Effects

High frequency heating apparatus 1D of the present exemplary embodiment can adjust the electric field strength between first electrode 11 and second electrodes 12 based on the shape of heating target object 90a, thereby reducing uneven heating of heating target object 90a, which has a non-uniform thickness.

Fifth Exemplary Embodiment

High frequency heating apparatus 1E according to a fifth exemplary embodiment of the present disclosure will now be described as follows. The present exemplary embodiment will be described, focusing mainly on features absent in the fourth exemplary embodiment. In the present exemplary embodiment, components identical to those in the fourth exemplary embodiment will be denoted by the same reference numerals, and the same description will not be repeated.

Figure 26:
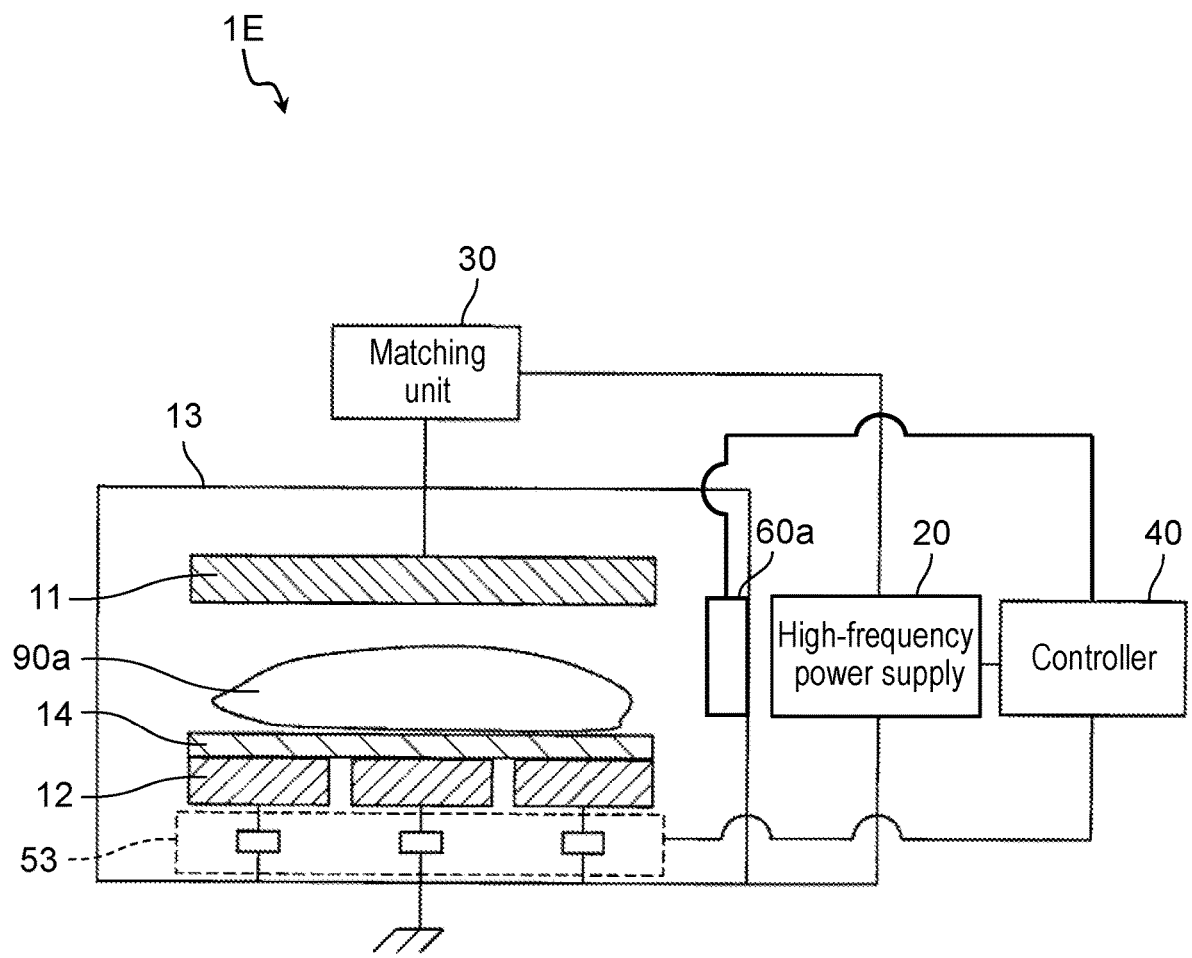
FIG. 26 is a schematic configuration of a high frequency heating apparatus according to a fifth exemplary embodiment of the present disclosure.

FIG. 26 is a schematic configuration of high frequency heating apparatus 1E. As shown in FIG. 26, the present exemplary embodiment differs from the fourth exemplary embodiment in including detector 60a instead of detector 60. Detector 60a is an infrared sensor for detecting the temperature of heating target object 90a that is placed between first electrode 11 and second electrodes 12.

Controller

Controller 40 controls electric field regulator 53 based on the temperature of heating target object 90a detected by detector 60a. More specifically, controller 40 moves the second electrodes 12 in the high-temperature region away from heating target object 90a, thereby reducing the electric field strength. Alternatively, controller 40 moves the second electrodes 12 in the low-temperature region closer to heating target object 90a, thereby increasing the electric field strength.

Effects

High frequency heating apparatus 1E of the present exemplary embodiment adjusts the electric field strength between first electrode 11 and second electrodes 12 based on the temperature distribution of heating target object 90a, thereby reducing uneven heating of heating target object 90a, which has a non-uniform thickness.

Modified Example

The present exemplary embodiment can be combined with any of the first to fourth exemplary embodiments. In other words, in the first to fourth exemplary embodiments, detector 60 may be replaced by detector 60a, and controller 40 may control electric field regulator 50 or 53 based on the temperature detected by detector 60a.

INDUSTRIAL APPLICABILITY

The high frequency heating apparatus according to the present disclosure is applicable to, for example, thawing apparatuses, heating cookers, and dryers for food or wood.

REFERENCE MARKS IN THE DRAWINGS 1A, 1B, 1C, 1D, 1E high frequency heating apparatus
11 first electrode
12, 12a, 12b, 12c second electrode
13 heating chamber
14 table
20 high-frequency power supply
21 oscillator
22, 23 amplifier
30 matching unit
40 controller
50, 50a, 53, 53a electric field regulator
51a, 51b, 51c switching unit
52a, 52b, 52c impedance element
54a, 54b, 54c movable unit
55b, 55c, 56a, 56b, 56c bar-shaped member
60, 60a detector
81 analysis model
90a, 90b heating target object
91 flat part
92 inclined part

The invention claimed is:

1. A high frequency heating apparatus comprising:
a first electrode that is flat;
a plurality of second electrodes placed opposite to the first electrode, the plurality of second electrodes each being flat;
a high-frequency power supply configured to apply a high-frequency voltage to the first electrode;
a matching unit placed between the first electrode and the high-frequency power supply and configured to be impedance-matched with the high-frequency power supply;
a controller configured to control the high-frequency power supply; and
an electric field regulator configured to individually adjust electric field strengths in a plurality of regions located between the first electrode and the plurality of second electrodes,
wherein the electric field regulator comprises a plurality of impedance elements placed between the plurality of second electrodes and a ground, the plurality of impedance elements being passive elements, and the electric field regulator making the plurality of impedance elements adjust impedances between the plurality of second electrodes and the ground.

2. The high frequency heating apparatus according to claim 1, wherein
the electric field regulator further includes a plurality of switching units placed between the plurality of second electrodes and the ground, and
the plurality of switching units perform switching between
connecting the plurality of second electrodes to the ground via the plurality of impedance elements, and
connecting the plurality of second electrodes to the ground directly.

3. The high frequency heating apparatus according to claim 2, wherein the electric field regulator makes the plurality of switching units
connect at least one central second electrode among the plurality of second electrodes directly to the ground, the at least one central second electrode corresponding to a central region of the plurality of regions, and
connect at least one outer second electrode among the plurality of second electrodes to the ground via one of the plurality of impedance elements, the at least one outer second electrode corresponding to a non-central region that is a region except the central region among the plurality of regions.

4. The high frequency heating apparatus according to claim 1, further comprising a detector configured to detect a shape of a heating target object when the heating target object is placed between the first electrode and the plurality of second electrodes,
wherein the controller controls the electric field regulator based on the shape of the heating target object detected by the detector.

5. The high frequency heating apparatus according to claim 1, further comprising a detector configured to detect a temperature of a heating target object when the heating target object is placed between the first electrode and the plurality of second electrodes,
wherein the controller controls the electric field regulator based on the temperature of the heating target object detected by the detector.

6. A high frequency heating apparatus comprising:
a first electrode that is flat;
a plurality of second electrodes placed opposite to the first electrode, the plurality of second electrodes each being flat;
a high-frequency power supply configured to apply a high-frequency voltage to the first electrode;
a matching unit placed between the first electrode and the high-frequency power supply and configured to be impedance-matched with the high-frequency power supply;
a controller configured to control the high-frequency power supply;
an electric field regulator configured to individually adjust electric field strengths in a plurality of regions located between the first electrode and the plurality of second electrodes; and
a table on which a heating target object is to be placed, the heating target object being arranged between the first electrode and the plurality of second electrodes,
wherein
all of the plurality of second electrodes are grounded, and
the electric field regulator differentiates
a spacing between the first electrode and at least one central second electrode among the plurality of second electrodes, the at least one central second electrode corresponding to the central region of the plurality of regions, and a spacing between the table and the at least one central second electrode, from
a spacing between the first electrode at least one outer second electrode among the plurality of second electrodes, at least one outer second electrode corresponding to the non-central region that is a region except the central region among the plurality of regions, and a spacing between the table and the at least one outer second electrode,
thereby adjusting the electric field strengths in the plurality of regions.

7. The high frequency heating apparatus according to claim 6, wherein the electric field regulator comprises a plurality of bar-shaped members configured to ground the plurality of second electrodes, the electric field regulator making the plurality of bar-shaped members have different lengths so as to differentiate between the spacing between the first electrode and the at least one central second electrode, and the spacing between the first electrode and the at least one outer second electrode.

8. The high frequency heating apparatus according to claim 6, wherein the electric field regulator comprises a plurality of movable units configured to ground the plurality of second electrodes, and the plurality of movable units move the plurality of second electrodes in a direction perpendicular to the first electrode.

9. The high frequency heating apparatus according to claim 8, wherein the electric field regulator controls the plurality of movable units so that a spacing between the first electrode and the at least one central second electrode is smaller than a spacing between the first electrode and the at least one outer second electrode.

* * * * *